US011686007B2

(12) United States Patent
Majumdar et al.

(10) Patent No.: US 11,686,007 B2
(45) Date of Patent: Jun. 27, 2023

(54) TIN-INDIUM ALLOY ELECTROPLATING SOLUTION

(71) Applicant: New Mexico Tech University Research Park Corporation, Socorro, NM (US)

(72) Inventors: Bhaskar S. Majumdar, Socorro, NM (US); Sherin Bhassyvasantha, Socorro, NM (US); Luke Soule, Albuquerque, NM (US)

(73) Assignee: NEW MEXICO TECH UNIVERSITY RESEARCH PARK CORPORATION, Socorro, NM (US)

( * ) Notice: Subject to any disclaimer, the term of this patent is extended or adjusted under 35 U.S.C. 154(b) by 0 days.

(21) Appl. No.: 16/220,883

(22) Filed: Dec. 14, 2018

(65) Prior Publication Data

US 2019/0233962 A1 Aug. 1, 2019

Related U.S. Application Data

(60) Provisional application No. 62/607,135, filed on Dec. 18, 2017.

(51) Int. Cl.
| | |
|---|---|
| C25D 3/56 | (2006.01) |
| C25D 3/60 | (2006.01) |
| C25D 3/32 | (2006.01) |
| C25D 3/30 | (2006.01) |
| H05K 3/24 | (2006.01) |
| C23C 18/31 | (2006.01) |
| C25D 17/10 | (2006.01) |

(52) U.S. Cl.
CPC ............... *C25D 3/60* (2013.01); *C23C 18/31* (2013.01); *C25D 3/30* (2013.01); *C25D 3/32* (2013.01); *C25D 17/10* (2013.01); *H05K 3/24* (2013.01)

(58) Field of Classification Search
CPC .................................. C25D 3/56; C25D 3/60
USPC .................................................. 205/238, 253
See application file for complete search history.

(56) References Cited

U.S. PATENT DOCUMENTS 3,389,060 A * 6/1968 Greene ................... C23C 18/54
205/261
4,013,523 A * 3/1977 Stevens ..................... C25D 3/62
205/247

(Continued)

FOREIGN PATENT DOCUMENTS

| CN | 102424995 A | 4/2012 |
|---|---|---|
| JP | 3904333 B2 | 4/2007 |
| JP | 2017031447 A | 2/2017 |

OTHER PUBLICATIONS

Pedan et al., "Electrodeposition of Indium-Tin Alloy," Gal'vanotekhnika 1 Obrabotka Poverkhnosti (1994), vol. 3, Nos. 5-6, pp. 55-57. Abstract Only. (Year: 1994).*

(Continued)

*Primary Examiner* — Edna Wong
(74) *Attorney, Agent, or Firm* — Wilson Sonsini Goodrich & Rosati

(57) ABSTRACT

The disclosure provides a Sn—In electroplating bath that is Pb-free, environmentally safe, operates at room temperature, and does not require changes in existing plating assemblies. Room temperature aging and limited thermal cycling tests show that the electroplated Sn—In alloy film on a Cu substrate effectively mitigates whisker growth.

18 Claims, 17 Drawing Sheets

(56) References Cited

U.S. PATENT DOCUMENTS

| | | | | |
|---|---|---|---|---|
| 4,278,477 | A * | 7/1981 | Reinhold | C23C 22/83 |
| | | | | 106/14.12 |
| 5,873,953 | A * | 2/1999 | Schriever | C23C 22/68 |
| | | | | 148/273 |
| 6,063,172 | A | 5/2000 | Bokisa et al. | |
| 6,331,240 | B1 | 12/2001 | Tsunoda et al. | |
| 2005/0199506 | A1 | 9/2005 | Toben et al. | |
| 2006/0096867 | A1 * | 5/2006 | Bokisa | C25D 3/56 |
| | | | | 205/253 |
| 2006/0113006 | A1 * | 6/2006 | Masuda | C25D 3/32 |
| | | | | 205/253 |
| 2018/0355500 | A1 * | 12/2018 | Sperling | C25D 5/611 |
| 2019/0368063 | A1 * | 12/2019 | Yamaguchi | H01L 24/13 |

OTHER PUBLICATIONS

Anwar et al., An XPS Study of Amorphous Thin Films of Mixed Oxides In2O3 SnO2 System Deposited by Co-Evaporation, International Journal of Modern Physics B vol. 21(7), 2007; pp. 1027-1042.

Application Note, Achieving A Finer Grain Structure Using the Indium Sulfamate Plating Bath, Indium Corporation.

Ashworth et al., An Investigation into the Effect of a Post-electroplating Electrochemical Oxidation Treatment on Tin Whisker Formation, Journal of Electronic Materials, vol. 44(1), 2015, pp. 442-456.

Banerjee et al., A molecular dynamics evaluation of the effect of dopant addition on grain boundary diffusion in tin: Implication for whisker growth, Materials Science & Engineering A 666, 2006; pp. 191-198.

Bevolo et al., A Leels and Auger Study of the Oxidation of Liquid and Solid Tin, Surface Science 134, 1983; pp. 499-528.

Boettinger, et al., Whisker and Hillock formation on Sn, Sn—Cu and Sn—Pb electrodeposits, Acta Materialia 53, 2003; pp. 5033-5050.

Brusse et al., Tin Whiskers: A History of Documented Electrical System Failures, A Briefing Prepared for the Space Shuttle Program Office, Apr. 2006; pp. 1-28.

Brusse, et al., Tin Whiskers: Attributes and Mitigation, CARTS 2002: 22nd Capacitor and Resistor Technology Symposium, Mar. 25-29, 2002; pp. 67-80.

Buchovecky et al., A model of Sn whisker growth by coupled plastic flow and grain boundary diffusion, Appl. Phys. Lett. 94, 2009.

CALCE-EPSC, Mitigation Strategies for Tin Whiskers, Release 1.0, Jul. 3, 2002.

Chang et al., Investigation of Sn Whisker Growth in Electroplated Sn and Sn—Ag as a Function of Plating Variables and Storage Conditions, Journal of Electronic Materials, vol. 43(1), 2014; pp. 259-269.

Chang et al., The Effect of Surface Aluminum Oxide Films on Thermally Induced Hillock Formation, Thin Solid Films, 228, 1993; pp. 205-209.

Chason, et al., Growth of whiskers from Sn surfaces: Driving forces and growth mechanisms, Progress in Surface Science 88 (2013), pp. 103-131.

Chason et al., Whisker formation in Sn and Pb—Sn coatings: Role of intermetallic growth, stress evolution, and plastic deformation processes, Applied Physics Letters, 2008; pp. 92-94.

Das Mahapatra et al., Eliminating Whisker Growth by Indium Addition in Electroplated Sn on Copper Substrate, Journal of Electronic Materials, vol. 46(7), 2017; pp. 4062-4075.

Das Mahapatra et al., Influence of Indium Addition on Whisker Growth in Electroplated Tin, Washington State University, May 2016.

Fujiwara, et al., Observation of the tin whisker by micro-Auger electron spectroscopy, J. Appl. Phys 51(12), Dec. 1980, pp. 6231-6232.

Galyon et al., A History of Tin Whisker Theory: 1946 to 2004, IBM eSG Group.

Galyon et al., Annotated Tin Whisker Bibliography And Anthology, Nemi, Inc., Version 1.2, Nov. 2003, pp. 1-64.

International search report and written opinion dated May 13, 2019 for PCT Application No. PCT/US2018/65759.

Jadhav et al., Whisker formation in Sn and Pb—Sn coatings: Role of intermetallic growth, stress evolution, and plastic deformation processes, Appl. Phys. Lett. 92, 2008, pp. 171901-171903.

Jo et al., Least lead addition to mitigate tin whisker for ambient storage, J Mater Sci: Mater Electron 24, 2013; pp. 3108-3115.

Konetzki, et al., Oxidation of Pb-2.9 at. % Sn alloys, J. Mater. Res. 3(3), 1988; pp. 466-470.

Lahiri, et al., Auger analysis of thin oxide films on Pb—In alloys, J. Chem. Phys. 63; Sep. 2008; pp. 2758-2764.

Lee et al., ECLSS Sustaining Metal Materials Compatibility Final Report, Electrochemical and Crevice Corrosion Test Results, NASA/CR, Apr. 2015.

Lee et al., Spontaneous Growth Mechanism of Tin Whiskers, Acta mater. Vol. 46 (10), 1998, pp. 3701-3714.

Meinshausen et al., Influence of Indium Addition on Whisker Mitigation in Electroplated Tin Coatings on Copper Substrates, Journal of Electronic Materials, vol. 45(1), 2016.

Mohram, et al., Hydrogen evolution reaction on Sn, In, and Sn—In alloys in carboxylic acids, J. Solid State Electrochem 13, 2009, pp. 1147-1155.

Moon, et al., Observed Correlation of Sn Oxide Film to Sn Whisker Growth in Sn—Cu Electrodeposit for Pb-Free Solders, Journal of Electronic Materials, vol. 34(9), 2005; pp. L31-L33.

Nakadaira et al., Growth of tin whiskers for lead-free plated leadframe packages in high humid environments and during thermal cycling, Microelectronics Reliability 48 (2008); pp. 83-104.

Product Data Sheet, Indium Sulfamate Plating Bath, Material Safety Data Sheet, Indium Corporation, ISO 9001 Registered.

Product Data Sheet, Indium Sulfamate Plating Bath, Safety Data Sheet, Indium Corporation, ISO 9001 Registered.

Rehim et al., Anodic behaviour of tin in maleic acid solution and the effect of some inorganic inhibitors, Corrosion Science 46, 2014; pp. 1071-1082.

Rehim et al., Electrochemical behaviour of a tin electrode in tartaric acid solutions, Journal of Alloys and Compounds 424, 2006; pp. 88-92.

Sarobol et al., Defect Morphology and Texture in Sn, Sn—Cu, and Sn—Cu—Pb Electroplated Films, IEEE vol. 33(3), 2010; pp. 159-164.

Sheng et al., Tin whiskers studied by focused ion beam imaging and transmission electron microscopy, Journal of Applied Physics 92(64), 2002; pp. 63-69.

Shin et al., Compressive Stress Generation in Sn Thin Films and the Role of Grain Boundary Diffusion, Phys. Rev. Lett., vol. 103(5), Jul. 31, 2009.

Sobiech et al., Driving force for Sn whisker growth in the system Cu—Sn, Appl. Phys. Lett., Jul. 2008.

Sobiech et al., Stress Relaxation Mechanisms of Sn and SnPb Coatings Electrodeposited on Cu: Avoidance of Whiskering, Journal of Electronic Materials, Nov. 2011; pp. 2300-2313.

Song et al., Angular-dependent photoemission studies of indium tin oxide surfaces, Appl. Phys. A 72, 2001; pp. 361-365.

Jenko, et al., High-resolution AES analysis andimaging of In-80Sn oxidized surface using fieldemission auger microprobe, Vacuum 71, 2003; pp. 19-25.

Subramanian et al., Lead-Free Electronic Solders, A Special Issue of Journal of Materials Science: Materials in Electronics, 2007.

Suganuma et al., Sn whisker growth during thermal cycling, Acta Materialia 59, 2011; pp. 7255-7267.

Tu et al., Irreversible processes of spontaneous whisker growth in bimetallic Cu—Sn thin-film reactions, IBM Research Division, vol. 49(3), 1994.

Tu et al., Mechanism and Prevention of Spontaneous Tin Whisker Growth, Materials Transactions, vol. 46 (11), 2005; pp. 2300-2308.

Tu et al., Stress Analysis of Spontaneous SN Whisker Growth, J Mater Sci: Mater Election vol. 18, 2007; pp. 269-281.

Wang et al., An Investigation Into the Role of Lead as a Suppressant for Tin Whisker Growth in Electronics, IEEE, vol. 4(4), 2014; pp. 727-740.

(56) References Cited

OTHER PUBLICATIONS

Woodrow et al., Evaluation of Conformal Coatings as a Tin Whisker Mitigation Strategy, Part II, SMTA International Conference, Rosemont, IL, Sep. 24-28, 2006; pp. 1-33.
Woodrow, et al., Tracer Diffusion In Whisker-Prone Tin Platings, SMTA International Conference, Rosemont, 2006; pp. 1-50.

* cited by examiner

TIN-INDIUM ALLOY ELECTROPLATING SOLUTION

CROSS REFERENCE

This Application claims the benefit of U.S. Provisional Application No. 62/607,135, filed Dec. 18, 2017, which is incorporated herein by reference in its entirety.

GOVERNMENT RIGHTS

This invention was made with the support of the United States government under Grant Number CMMI-1335199 by the National Science Foundation. The government has certain rights in the invention.

BACKGROUND

Electroplated films of tin (Sn) are widely used in electronic lead frames for both soldering and oxidation protection. If left unalloyed, pure tin films develop long whiskers that can be hundreds of micrometers to millimeters long and 1-2 μm in diameter. Sn whiskers can short neighboring wire lines, and whisker growth is particularly severe in power electronics.

INCORPORATION BY REFERENCE

All publications, patents, and patent applications mentioned in this specification are herein incorporated by reference to the same extent as if each individual publication, patent, or patent application was specifically and individually indicated to be incorporated by reference.

SUMMARY OF THE INVENTION

In some embodiments, the disclosure provides an aqueous electroplating solution comprising: (a) a source of indium; (b) a source of tin; (c) an organic complexing agent; (d) a pH stabilizer; and (e) an inorganic complexing agent; wherein the pH of the electroplating solution is from about 1 to about 2.

In some embodiments, the disclosure provides a method comprising contacting an anode, a reference electrode, and a substrate to an aqueous electroplating solution, wherein the aqueous electroplating solution comprises: (a) a source of indium; (b) a source of tin; (c) an organic complexing agent; (d) a pH stabilizer; and (e) an inorganic complexing agent, wherein the electroplating solution has a pH from about 1 to about 2.

In some embodiments, the disclosure provides an electroplating bath prepared by a process, the process comprising: (i) dissolving an inorganic complexing agent in deionized water in a container; (ii) adding a cleaning agent to the container; (iii) preparing an indium solution comprising an indium source, an acid, and water; (iv) adding the indium solution to the container; (v) adding a reducing agent and an organic complexing agent to the container; (vi) preparing a tin solution comprising a source of tin and water; and (vii) adding the tin solution to the container.

BRIEF DESCRIPTION OF THE FIGURES

FIG. 10 shows an Auger electron spectroscopy intensity profile of line trace L2 in FIG. 9, wherein the grain boundaries are enriched with In.

DETAILED DESCRIPTION OF THE INVENTION

Electroplated films of tin are widely used in electronic lead frames for both soldering and oxidation protection. When left unalloyed, pure tin films may develop long whiskers. Whiskers can be hundreds of micrometers in length, and 1-2 μm in diameter, and can short neighboring wire lines. The shorting of neighboring wire lines can be a serious concern given the current trend in miniaturization of electronic systems. Whisker growth is particularly severe in power electronics.

Tin whisker growth can require three conditions: (i) the generation and sustenance of in-plane compressive stress through an ongoing reaction between the Sn (or Sn-alloy) film with the Cu substrate; (ii) rapid diffusion of atoms from the Cu—Sn interface or in the Sn film where compressive stress is high enough to feed the growth of whiskers at the film surface; and (iii) the presence of a tenacious oxide layer that prevents vacancy generation at the metal-oxide interface, thus preventing stress relaxation to minimize in-plane compressive stress.

The chemicals and processes disclosed herein describe environmentally friendly Pb-free alloying techniques that co-deposit an Sn—In alloy without forming long whiskers.

The disclosure describes an electroplating solution that can simultaneously deposit Sn and In over a wide range of composition ratios. In some embodiments, the invention can be used to electroplate Sn—In alloy films, and provide tight composition control on the indium content. In some embodiments, the indium content of an electroplated Sn—In alloy film is about 0%, about 5%, about 7.5%, about 10%, about 15%, about 20%, about 25%, about 30%, about 35%, about 40%, about 45%, or about 50% by weight. In some embodiments, the indium content of an electroplated Sn—In alloy film is about 20% by weight. In some embodiments, the indium content of an electroplated Sn—In alloy film is about 30% by weight.

In some embodiments, the solution can be used to electroplate Sn—In alloy films, and provide uniform grain morphology. In some embodiments, the solution can be used to electroplate Sn—In alloy films under room temperature plating conditions. In some embodiments, the solution can be used to electroplate Sn—In alloy films, and allows the environmentally friendly use and disposal of chemicals.

Electroplating

Electroplating is a process that uses electric current to reduce dissolved metal cations to form a thin metal layer on an electrode. Electroplating plates the cathode of the circuit. The disclosure describes a method of electroplating a substrate, which acts as the cathode of the circuit, using an electroplating bath. The cathode, anode, and reference electrode are connected to a power source to form a circuit.

Figure 1:
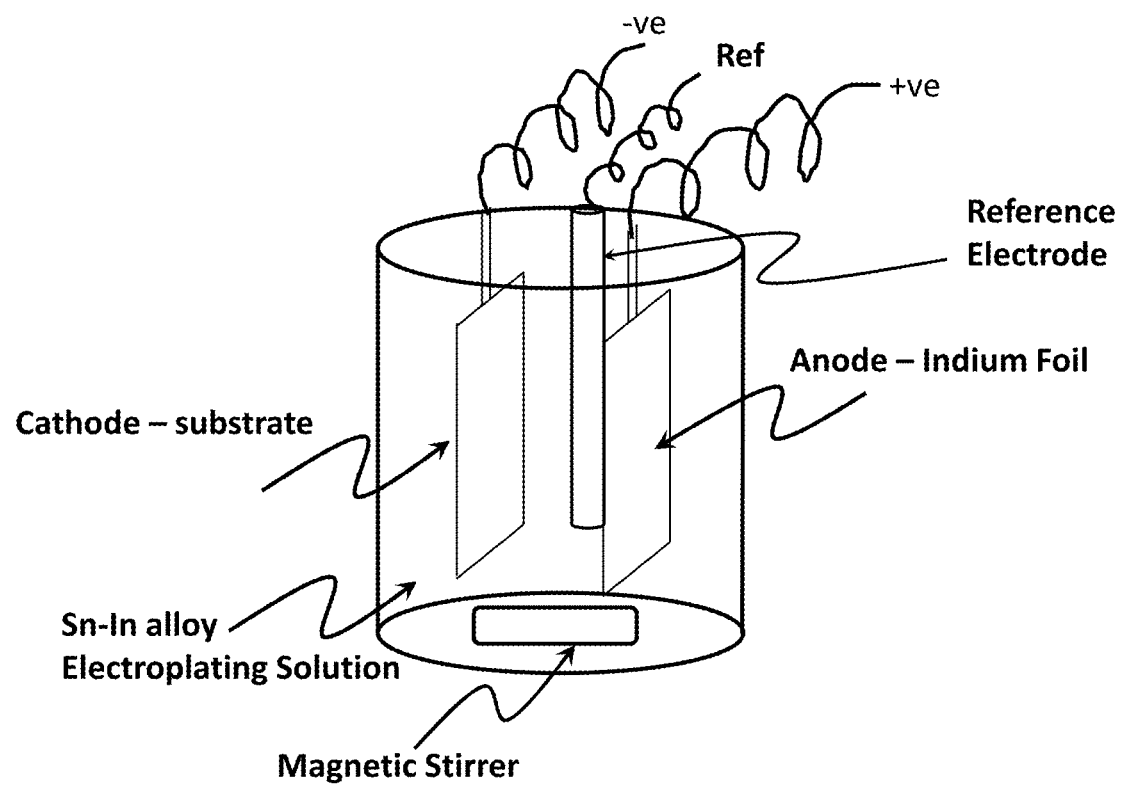
FIG. 1 is a sketch of a laboratory scale electroplating apparatus used to electroplate Sn—In alloys.

An electroplating system can comprise an electroplating bath (e.g., an electrolyte) and two or more electrodes. In some cases, an electroplating system can comprise a container, an anode, a cathode, a reference electrode, an electrolyte, a power source, and cables that connect the electrodes to the power source (FIG. 1).

The reference electrode can comprise an aqueous reference electrode, a nonaqueous reference electrode, and/or a quasi-reference electrode. Examples of the aqueous reference electrode can include standard hydrogen electrode, normal hydrogen electrode, reversible hydrogen electrode, saturated calomel electrode, copper-copper(II) sulfate electrode, silver chloride electrode, palladium-hydrogen electrode, dynamic hydrogen electrode, and mercury-mercurous sulfate electrode. Examples of nonaqueous reference electrode can include Ag/Ag+ reference electrode. In some embodiments, the reference electrode is a saturated $Hg/Hg_2Cl_2$ calomel electrode, or a Ag/AgCl electrode.

In some embodiments, the anode is made of the metal to be plated on the substrate. In some embodiments, the anode is made of a metal that is not to be plated on the substrate. In some embodiments, the anode is made of platinum, carbon, silver, zinc, aluminum, stainless steel, or magnesium. In some embodiments, the anode is made of indium or a Sn—In alloy with a majority Sn content. In some embodiments, the cathode (substrate) is made of copper, bronze (Cu—Sn alloys), etched Si, brass (Cu—Zn alloys), a low-expansion Fe—Ni alloy lead frame, a Ni-plated Cu alloy, or an Fe-alloy substrate.

A power source is used to pass current through a circuit. In some embodiments, the power source is a battery. In some embodiments, the power source is a rectifier, which converts alternating current (AC) electricity to a regulated low-voltage direct current (DC).

A substrate can be electroplated using different voltages. In some embodiments, a voltage of about 0 volt to about 0.5 volt, about 1 volt, about 2 volts, about 3 volts, about 4 volts, about 5 volts, about 6 volts, about 7 volts, about 8 volts, about 9 volts, about 10 volts, about 11 volts, about 12 volts, about 13 volts, about 14 volts, about 15 volts, about 16 volts, about 17 volts, about 18 volts, about 19 volts, or about 20 volts is used to electroplate a substrate.

A substrate can be electroplated using different amounts of current. In some embodiments, a current of about 0 amp to about 1 amp, about 1 amp, about 2 amps, about 3 amps, about 4 amps, about 5 amps, about 6 amps, about 7 amps, about 8 amps, about 9 amps, about 10 amps, about 11 amps, about 12 amps, about 13 amps, about 14 amps, about 15 amps, about 16 amps, about 17 amps, about 18 amps, about 19 amps, about 20 amps, about 21 amps, about 22 amps, about 23 amps, about 24 amps, about 25 amps, about 26 amps, about 27 amps, about 28 amps, about 29 amps, or about 30 amps is used to electroplate a substrate.

A substrate can be electroplated using an electroplating bath at different temperatures. In some embodiments, a substrate is electroplated using an electroplating bath at about 20° C., about 30° C., about 40° C., about 50° C., about 60° C., about 70° C., about 80° C., about 90° C., about 100° C., about 110° C., or about 120° C. In some embodiments, a substrate is electroplated using an electroplating bath at room temperature. In some embodiments, a substrate is electroplated using an electroplating bath at about 60° C. to about 110° C.

A substrate can be electroplated over varying amounts of time. In some embodiments, a substrate is electroplated over from about 0 hour to about 1 hour, about 1 hour, about 2 hours, about 3 hours, about 4 hours, about 5 hours, about 6 hours, about 7 hours, about 8 hours, about 9 hours, about 10 hours, about 11 hours, about 12 hours, about 13 hours, about 14 hours, about 15 hours, about 16 hours, about 17 hours, about 18 hours, about 19 hours, about 20 hours, about 21 hours, about 22 hours, about 23 hours, or about 24 hours. In some embodiments, a substrate is electroplated over about 1 day, about 2 days, about 3 days, about 4 days, about 5 days, about 6 days, about 7 days, about 8 days, about 9 days, about 10 days, about 11 days, about 12 days, about 13 days, or about 14 days. In some embodiments, a substrate is electroplated over about 1 week, about 2 weeks, about 3 weeks, about 4 weeks, about 5 weeks, about 6 weeks, about 7 weeks, about 8 weeks, about 9 weeks, about 10 weeks, about 11 weeks, or about 12 weeks. In some embodiments, a substrate is electroplated over about 1 month, about 2 months, about 3 months, about 4 months, about 5 months, about 6 months, about 7 months, about 8 months, about 9 months, about 10 months, about 11 months, or about 12 months. In some embodiments, a substrate is electroplated over about 1 year, about 2 years, about 3 years, about 4 years, or about 5 years. In some embodiments, a substrate can be electroplated over from 0 to about 1 hour, about 1 hour, about 2 hours, about 3 hours, or about 4 hours. In some embodiments, a substrate can be electroplated over a period of about 0.002 hour to about 1 hour.

A substrate can be electroplated at, above, or below atmospheric pressure. In some embodiments, a substrate can be electroplated at atmospheric pressure.

Substrate

The substrate for electrodeposition can be a conductive surface. In some embodiments, the substrate used in Sn and Sn—In alloy electrodeposition can be copper, bronze (Cu—Sn alloys), etched Si, or brass (Cu—Zn alloys). In some embodiments, the substrate for electrodeposition can be a silicon, dielectric, polymer, or glass substrate with adequate metallization on the surface of the substrate. In some embodiments, the substrate can be a Si or $SiO_2$ substrate with an under bump metallization (UBM) layer on the surface of the substrate. The substrate used in Sn and Sn—In alloy electrodeposition can be of 85%, 90%, 95%, 96%, 97%, 98%, 99%, 99.5%, 99.8%, or 99.9% purity. In some embodiments, the substrate used in Sn and Sn—In alloy electrodeposition is copper of 99.9% purity. In some embodiments, the substrate used in Sn and Sn—In alloy electrodeposition is an Fe-based alloy, such as a low thermal expansion Fe—Ni alloy, stainless steel, a Ni-based alloy, Ni-plated Cu, a Cu-alloy, or an Fe-alloy.

A substrate can be subjected to pre-treatment to remove an outer oxide layer. In some embodiments, a substrate is pre-treated by rinsing or immersing the substrate in a dilute acid solution followed by multiple de-ionized water rinses. In some embodiments, the substrate is rinsed or immersed in sulfuric acid, nitric acid, or hydrochloric acid. In some embodiments, the substrate is rinsed or immersed in 10% sulfuric acid. In some embodiments, the surface is treated with a dilute alkaline solution followed by rinsing of the substrate in deionized water. In some embodiments, the surface of the substrate is cleaned with soapy water, and rinsed with deionized water.

Electroplating Solution

The electroplating solution for Sn—In alloy electrodeposition comprises an inorganic solvent/cleaning agent, an inorganic complexing agent, a source of In, an organic complexing agent, a grain refiner/reducing agent, a non-ionic surfactant, a source of Sn, and/or a solvent. In some embodiments, the inorganic solvent/cleaning agent is sulfamic acid ($H_3SNO_3$). In some embodiments, the inorganic complexing agent is sodium hydroxide (NaOH). In some embodiments, the In source is hydrated $InCl_3$ or In metal. In some embodiments, the organic complexing agent is nitrogenous, for example, triethanolamine (TEA). In some embodiments, the complexing agent is an amine, such as thiourea, EDTA, thioacetamide, or phenylenediamine. In some embodiments, the grain refiner is dextrose. In some embodiments, the reducing agent is any aldose, an aldehyde-containing sugar moiety, dextrose, $_D$-fructose, $_D$-galactose, or $_D$-ribose. In some embodiments, the non-ionic surfactant is Triton™ X-100. In some embodiments, the Sn source is sodium tin oxide hydrate ($Na_2O_6SnH_6$). In some embodiments, the solvent is water. In some embodiments, the solvent is deionized water. In some embodiments, gelatin and phenolphthalein can be added to a electroplating solution to improve the brightness of the coating and current efficiency.

In some embodiments, the electroplating solution comprises about 1 w/w %, about 2 w/w %, about 3 w/w %, about 4 w/w %, about 5 w/w %, about 6 w/w %, about 7 w/w %, about 8 w/w %, about 9 w/w %, about 10 w/w %, about 11 w/w %, about 12 w/w %, about 13 w/w %, about 14 w/w %, or about 15 w/w % of an inorganic solvent/cleaning agent, for example, sulfamic acid. In some embodiments, the electroplating solution comprises about 0.5 w/w %, about 0.6 w/w %, about 0.7 w/w %, about 0.8 w/w %, about 0.9 w/w %, about 1 w/w %, about 1.1 w/w %, about 1.2 w/w %, about 1.3 w/w %, about 1.4 w/w %, or about 1.5 w/w % of a base, for example, sodium hydroxide. In some embodiments, the electroplating solution comprises about 1 v/v %, about 1.5 v/v %, about 2 v/v %, about 2.5 v/v %, about 3 v/v %, about 3.5 v/v %, about 4 v/v %, about 4.5 v/v %, about 5 v/v %, about 10 v/v %, about 15 v/v %, about 20 v/v %, about 25 v/v %, about 30 v/v %, or about 35 v/v % of a source of indium, for example, an $InCl_3$. In some embodiments, the electroplating solution comprises about 1 w/w %, about 2 w/w %, about 3 w/w %, about 4 w/w %, about 5 w/w %, about 6 w/w %, about 7 w/w %, about 8 w/w %, about 9 w/w %, about 10 w/w %, about 11 w/w %, about 12 w/w %, about 13 w/w %, about 14 w/w %, about 15 w/w %, about 16 w/w %, about 17 w/w %, about 18 w/w %, about 19 w/w %, about 20 w/w %, about 21 w/w %, about 22 w/w %, about 23 w/w %, about 24 w/w %, about 25 w/w %, about 26 w/w %, about 27 w/w %, about 28 w/w %, about 29 w/w %, or about 30 w/w % In content.

In some embodiments, the electroplating solution comprises about 0.1 v/v %, about 0.2 v/v %, about 0.3 v/v %, about 0.4 v/v %, about 0.5 v/v %, about 0.6 v/v %, about 0.7 v/v %, about 0.8 v/v %, about 0.9 v/v %, or about 1 v/v % of a nitrogenous complexing agent, for example, TEA. In some embodiments, the electroplating solution comprises about 0.05 w/w %, about 0.1 w/w %, about 0.15 w/w %, about 0.2 w/w %, about 0.25 w/w %, about 0.3 w/w %, about 0.35 w/w %, about 0.4 w/w %, about 0.45 w/w %, or about 0.5 w/w % of a reducing agent, for example, dextrose. In some embodiments, the electroplating solution comprises about 0.5 w/w %, about 0.6 w/w %, about 0.7 w/w %, about 0.8 w/w %, about 0.9 w/w %, about 1.0 w/w %, about 1.1 w/w %, about 1.2 w/w %, about 1.3 w/w %, about 1.4 w/w %, about 1.5 w/w %, about 1.6 w/w %, about 1.7 w/w %, about 1.8 w/w %, about 1.9 w/w %, about 2.0 w/w %, about 2.1 w/w %, about 2.2 w/w %, about 2.3 w/w %, about 2.4 w/w %, about 2.5 w/w %, about 2.6 w/w %, about 2.7 w/w %, about 2.8 w/w %, about 2.9 w/w %, about 3.0 w/w %, about 3.2% w/w %, about 3.4 w/w %, about 3.6 w/w %, about 3.8 w/w %, about 4.0 w/w %, about 4.2 w/w %, about 4.4 w/w %, about 4.6 w/w %, about 4.8 w/w %, or about 5.0 w/w % of a source of tin, for example, sodium tin oxide hydrate.

In some embodiments, the electroplating solution comprises about 0.05 v/v %, about 0.1 v/v %, about 0.15 v/v %, about 0.2 v/v %, about 0.25 v/v %, about 0.3 v/v %, about 0.35 v/v %, or about 0.4 v/v % of a non-ionic surfactant, for example, Triton™ X-100.

In some embodiments, the electroplating solution can comprise:
  about 0.002 to about 0.012 moles/liter of an In salt, for example, $InCl_3$;
  about 0.01 to about 0.040 moles/liter of an Sn salt, for example, sodium tin stannate;
  about 1.0 to about 3.0 moles/liter of sulfamic acid;
  about 0.2 to about 0.8 moles/liter of an inorganic complexing agent, for example, sodium hydroxide;
  about 0.02 to about 0.20 moles/liter of a pH stabilizer, for example, a 10% solution of reagent grade hydrochloric acid;
  about 0.001 to about 0.004 moles/liter of a reducing agent, for example, a carbohydrate such as an aldose or dextrose;
  about 0.002 to about 0.008 moles/liter of an organic complexing agent, for example, an amine-containing organic compound;
  about 0.0005 to about 0.0016 moles/liter of a surfactant, such as Triton™ X-100 or polyethylene glycol;

optionally about 0.2 to about 0.8 mL/liter of a grain refiner, for example, gelatin; and optionally 0.0005 to about 0.0015 moles/liter of a brightener, for example, phenolphthalein.

In some embodiments, the aqueous electroplating solution of the disclosure comprises a source of indium in an amount of about 0.002 mol/L to about 0.012 mol/L. In some embodiments, the aqueous electroplating solution of the disclosure comprises a source of tin in an amount of about 0.01 mol/L to about 0.10 mol/L. In some embodiments, the aqueous electroplating solution of the disclosure comprises a pH stabilizer in an amount of about 0.02 mol/L to about 0.20 mol/L. In some embodiments, the aqueous electroplating solution of the disclosure comprises a pH stabilizer in an amount of about 0.03 mol/L to about 0.15 mol/L.

In some embodiments, the electroplating solution further comprises an alkali tartrate or a citrate to reduce the loss of throwing power of the electroplating solution with age. In some embodiments, the electroplating solution comprises potassium sodium tartrate (Rochelle salt). In some embodiments, the electroplating solution comprises sodium citrate.

The electroplating solution can have a pH of about 0.5, about 0.6, about 0.7, about 0.8, about 0.9, about 1.0, about 1.1, about 1.2, about 1.3, about 1.4, about 1.5, about 1.6, about 1.7, about 1.8, about 1.9, about 2.0, about 2.1, about 2.2, about 2.3, about 2.4, or about 2.5. In some embodiments, the pH of the electroplating solution is adjusted using an acid (e.g., sulfamic acid).

The electroplating bath can be used for the electrodeposition of substrates at various temperatures. In some embodiments, the electroplating bath is used for the electrodeposition of substrates at room temperature. In some embodiments, the electroplating bath is used for the electrodeposition of substrates at about 20° C., about 25° C., or about 30° C. In some embodiments, the electroplating bath is used for the electrodeposition of substrates at about 60° C., about 70° C., about 80° C., about 90° C., about 100° C., about 110° C., about 120° C., about 130° C., about 140° C., about 150° C., or about 160° C. In some embodiments, the electroplating bath comprises an anti-oxidant (e.g., sodium potassium tartrate or sodium citrate), and the solution is used for the electrodeposition of substrates above 100° C.

In some embodiments, the disclosure provides an electroplating bath prepared by a process, the process comprising: (i) making a dilute aqueous solution of inorganic buffer containing an alkali hydroxide, and slowly adding inorganic amine containing sulfur-based acid in deionized water and stirring until solution is clear; (ii) adding an aliphatic sugar-based reducing agent and alkyl amine complexing agent; (iii) adding a sodium salt of tin and stirring; (iv) separately preparing a 10 percent hydrochloric acid solution containing indium and slowly adding it to the main container; and (v) adding a non-ionic surfactant and stirring the resulting solution until the entire bath is clear.

A substrate can be cleaned or pre-treated before electrodeposition using the electroplating bath. In some embodiments, the substrate is degreased using soap and water, followed by a wash using deionized water. In some embodiments, the substrate is washed using a volatile organic solvent. In some embodiments, the substrate is washed using methanol, isopropanol, or ethanol. In some embodiments, the substrate is dried using air or an argon atmosphere. In some embodiments, the substrate is dipped into a $H_2SO_4$ solution to remove the native oxide layer on the Cu substrate. In some embodiments, the $H_2SO_4$ solution to remove the native oxide layer on the Cu substrate is about 5% $H_2SO_4$, about 10% $H_2SO_4$, about 15% $H_2SO_4$, about 20% $H_2SO_4$, about 25% $H_2SO_4$, or about 30% $H_2SO_4$. In some embodiments, the Cu cathode foil/sheet is pretreated by: 1) degreasing with soap water and rinsing the Cu cathode with deionized water; 2) cleaning the Cu foil using a volatile organic solvent; 3) drying the Cu foil in air or an argon gas atmosphere; and 4) dipping the Cu foil into a 10% $H_2SO_4$ solution to remove the native oxide layer on the Cu surface.

The electroplating bath can be fit for commercial applications in the electronics industry. In some embodiments, the bath can be used as an alternative solder electroplating solution for Pb-free electronic packaging. In some embodiments, the electroplating process can be used in flip chip technology, where ball grid arrays are used for chip attachment.

Analyses

The thickness of the electroplated alloy sample can be measured using various analytical techniques. In some embodiments, the thickness of the electroplated alloy sample can be measured using a white light Zygo interferometer. In some embodiments, the thickness of an electroplated alloy sample can be measured using a focused ion beam (FIB) probe on a dual channel FIB instrument. In some embodiments, the thickness of the electroplated alloy sample can be measured using stylus-based surface profilometry, optical surface profilometry, or glancing incident X-ray fluorescence (GI-XRF).

EXAMPLES

Example 1

Substrate

The primary substrate used for Sn and Sn—In alloy electrodeposition was industrial-grade copper (99.9% purity). Bronze (Cu—Sn alloys), etched Si, and brass (Cu—Zn alloys) were also used for Sn and Sn—In alloy electrodeposition. Other lead-frame substrates, such as alloy 42 were also used. Alloy 42 is a Fe—Ni alloy with 40 weight % Ni, and possesses low thermal expansion coefficients for compatibility with Si.

Example 2

Compositions of Sn—In Alloy Baths

The composition and amounts of each agent of the Sn—In alloy bath were as follows:

| Agent | Amount |
| --- | --- |
| Sulfamic acid ($H_3SNO_3$) | ~18-30 g |
| Sodium hydroxide (NaOH) | 1.2-2.5 g |
| Hydrated $InCl_3$ in concentrated HCl | ~3-12 mL |
| Triethanolamine (TEA) | ~0.4 mL (3 drops) |
| Dextrose | 0.01-0.08 g |
| Sodium tin oxide hydrate ($Na_2O_6SnH_6$) | ~0.4-0.8 g |
| Triton ™ X-100 | ~0.2 mL (2-3 drops) |
| Deionized water | To make up 100 mL of the electrolyte |

The compositions of control and sample Sn—In alloy bath solutions are presented below. The electroplating baths used different conditions during the electroplating process.

| Approximate reagent composition (moles/L) | Sn—0In (w/w %) plating | Sn—8In (w/w %) plating | Sn—30In (w/w %) plating |
|---|---|---|---|
| Hydrated Indium | — | 0.03 | 0.006 |
| Sn salt (sodium stannate trihiydrate) | 0.04 | 0.017 | 0.028 |
| Sulfamic acid reagent grade | 1.8 | 2.1 | 2.3 |
| Inorganic complexing agent | — | 0.425 | 0.5 |
| pH stabilizer | — | 0.097 | 0.110 |
| Reducing agent | 0.0016 | 0.0016 | 0.0032 |
| Complexing agent | 0.003 | 0.003 | 0.006 |
| Surfactant, non-ionic | 6.41E-4 | 6.41E-4 | 0.0012 |
| Grain refiner (optional) (mL/L) | 0.3 | 0.3 | 0.7 |
| Brightener (optional) | 6.28E-4 | 6.28E-4 | 0.0012 |
| Deionized water | Remaining for 1 L bath | Remaining for 1 L bath | Remaining for 1 L bath |
| Cathodic reduction potential w.r.t. SCE | More positive | Intermediate | More negative |

The inorganic complexing agent used was caustic flakes. The pH stabilizer used was reagent grade HCl. The pH was maintained below 2 using concentrated (37 w/w %) HCl. The reducing agent was an aldehyde-containing compound comprising an oxygen atom with lone pairs in the ring, which was open to hydrolysis or oxidation. Any aldose, dextrose, D-fructose, D-galactose, D-ribose, or aldehyde-containing sugar can be used as a reducing agent.

The complexing agent used was an amine-containing compound with a nitrogen atom carrying a lone pair that effectively formed a coordination complex with $In^+$ ions. Chloride ions assisted in the formation of the coordination complex. Triethanolamine, or a ternary or quaternary amines, such as thiourea, EDTA, thioacetamide, or phenylenediamine can be used as a complexing agent in the electroplating baths. Alkaline operating conditions were used for baths containing EDTA.

The surfactant used in the electroplating baths were non-ionic surfactants, such as Triton X-100 or polyethylene glycol (PEG). The optional grain refiner used in the electroplating baths were used to obtain more refined grains and microstructures. Heavy fatty acid chains contained in compounds, such as gelatin (animal glue), were optionally added to the electroplating baths. Phenolphthalein was optionally used as a brightening agent in the electroplating baths. Phenolphthalein was mixed with a surfactant to increase water solubility.

Example 3

Bath Preparation

The procedure for preparing the Sn—In alloy bath of the invention followed the steps below.

Step 1: In a glass beaker, 0.9-2.0 g of NaOH was dissolved in 60 mL of deionized water with continuous stirring using a magnetic stirrer at 200 revolutions per minute (rpm).

Step 2: 15-30 g of sulfamic acid powder was slowly added to the solution from step 1. The solution was stirred at 200 rpm. Slow addition of the sulfamic acid powder prevented excessive heating and neutralization of the reaction.

Step 3: The $InCl_3$ hydrated solution was prepared separately using one of two methods. In the first method, 7-10 g of Indium metal was dissolved in 200 mL of concentrated hydrochloric acid (37 v/v %). In the second method, 12-20 g of 99 weight % $InCl_3$ powder was dissolved in 200 mL of concentrated hydrochloric acid.

Step 4: 3-12 mL of the $InCl_3$ hydrated solution was slowly added to the mixture resulting from step 2. The mixture was stirred at 200 rpm.

Step 5: 0.01-0.08 g of dextrose and ~0.4 mL (3 drops) of TEA were added to the solution of step 2 and stirred.

Step 6: 0.4-1 g of sodium stannate ($Na_2O_6SnH_6$) was dissolved in 10-15 mL of deionized water. The $Na_2O_6SnH_6$ solution was then slowly added to the mixture of step 5 while stirring. Deionized water was added to the resulting solution to make 100 mL of the electroplating solution.

Step 7: Approximately 0.2 mL (2 drops) of the non-ionic surfactant Triton™ X-100 was added to the final electrolyte bath resulting from Step 6. The liquid was clear and did not exhibit any turbidity. Deionized water was added to make 100 mL of the electroplating solution.

The use of sodium sulfamate resulted in increased indium yields compared to the use of sulfamic acid. Sulfamic acid was used to control the pH of the solution, when the desired pH level was between 1 and 2. Higher pH levels resulted in incipient precipitation of cation complexes, which were harmful for the simultaneous electrodeposition of Sn and In. Small additions of alkali tartrates or citrates (Rochelle salt or sodium citrate) imparted better resistance against precipitation in the baths upon aging.

The bath was prepared from a scale of about 100 mL to about 2 liters. The same processing conditions were used to prepare the 2 liter electroplating bath. Samples coated using the 2 liter bath had a coating thickness of up to 15 µm. Scanning microscopy of the samples prepared using the 2 liter bath after 6 months indicated the absence of tin whiskers.

Example 4

Procedure for Conducting Electroplating Experiments

The Cu cathode foil/sheet was pretreated using three cleaning steps. First, the Cu foil sheets were degreased using soap and water, and the washed Cu foil sheets were rinsed with deionized water. Second, the Cu foil was cleaned using a volatile organic solvent, such as methanol, isopropanol, or acetone. The cleaned Cu foil was dried with air or under an argon gas atmosphere. Third, the samples were dipped into a 10% $H_2SO_4$ solution to remove the native oxide layer of the Cu foil surface.

Electroplating was conducted at room temperature. The electrolyte solution was stirred to disperse hydrogen bubbles formed at the cathode and to ensure uniform distribution of cation complexes around regions with varying geometries. A saturated calomel electrode was used as a reference electrode.

A continuous stirring rate of 100 to 250 rpm was used while samples were electroplated. The current density was varied according to the required thickness of electroplating. Current densities of 0.125 $mA/mm^2$ to 0.3 $mA/mm^2$ were used to deposit the Sn—In alloy. A pure Indium sheet was used as the anode. The Cu substrate was cut into small pieces of about 12 mm width, 1.0 mm thickness, and 50 mm length, and was used as the cathode.

FIG. 1 is a sketch of a laboratory scale electroplating apparatus used to electroplate Sn—In alloys.

Example 5

Product Assay

Coating Thickness

The thickness of the Sn—In alloy electroplating was measured using two techniques. The first technique used a white light Zygo interferometer, which provided an accuracy better than 0.1 μm. The second technique used a FIB probe on a dual channel FIB instrument. The second technique involved depositing Pt on the surface and using a Ga beam to cut through the thickness of the film. The second technique was also able to provide microstructures of the film samples.

Figure 2:
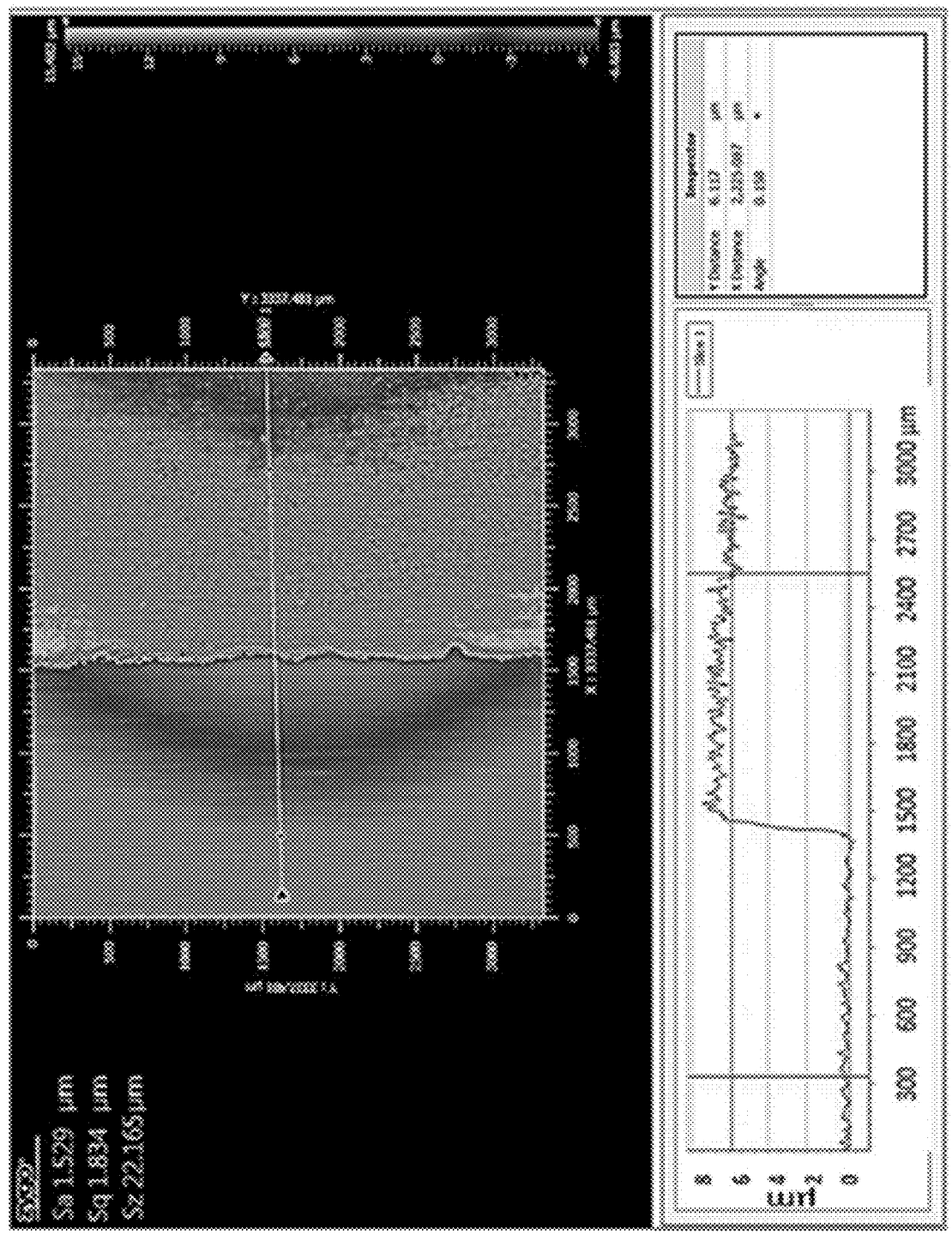
FIG. 2 TOP PANEL shows the Zygo interferometer pattern from the substrate (left) to the Sn—In alloy coating surface (right). The BOTTOM PANEL is a thickness trace showing a thickness step of approximately 6.1 μm upon crossing the central transition zone.

FIG. 2 TOP PANEL shows the Zygo interferometer pattern of the material. The region to the left of the near-vertical line represents the Cu substrate, and the region to the right of the near-vertical line represents the Sn—In alloy-coated surface. FIG. 2 BOTTOM PANEL is a thickness trace showing an abrupt height increase of approximately 6.1 μm, corresponding to the thickness of the Sn—In alloy film. The vertical lines represent locations where the height increase of 6.1 μm was obtained.

Figure 3:
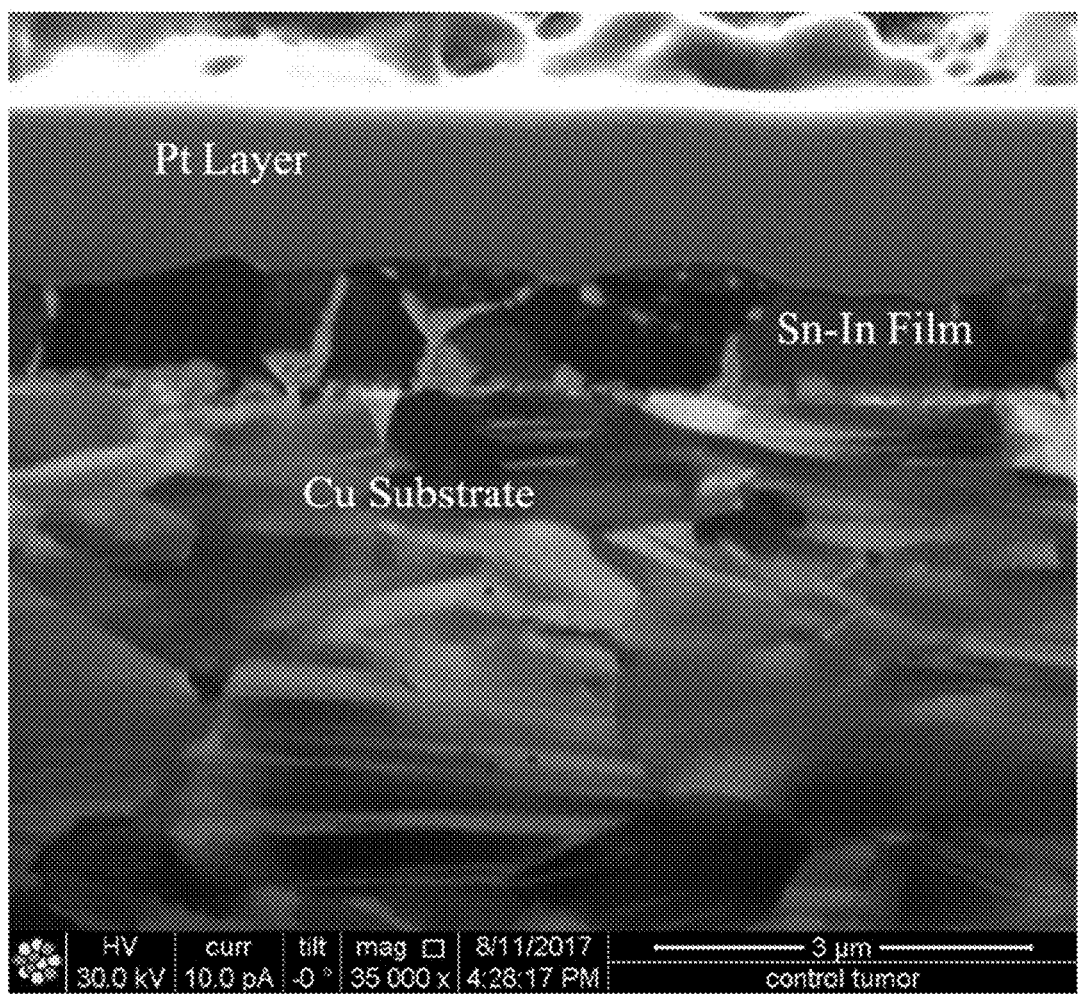
FIG. 3 shows results from the focused ion beam cross-section of a Sn-6In atomic % film.

FIG. 3 shows results from the FIB cross-section image of a Sn-6In atomic % film. FIG. 3 shows the Cu substrate at the bottom, and the Pt layer at the top that was deposited on the surface to protect the film from ion bombardment during the cross-sectioning procedure. A thin reaction zone between the Sn—In alloy and the Cu substrate was observed, which was a combination of Cu—Sn and Cu—In intermetallics. The thickness of the film was approximately 1 μm. The morphology of the Sn—In alloy grains was primarily columnar.

The thickness of the Sn—In electroplating was varied between 1 and 12 μm. The thickness of the film depended on the current density (increasing with increased current density), and was approximately a linear function of deposition time.

Figure 4:
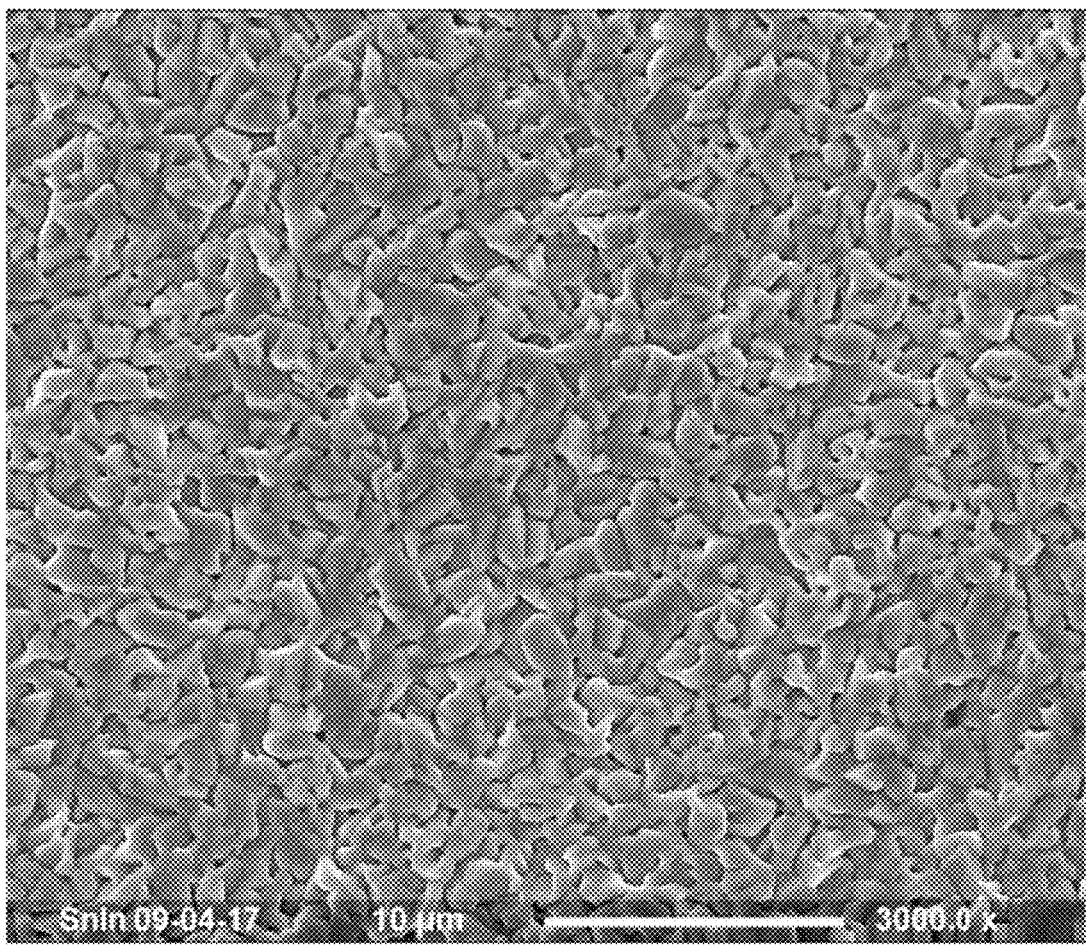
FIG. 4 shows the top surface of a Sn—In deposition sample (Sn-6In atomic %) at 3000× magnification.
Figure 5:
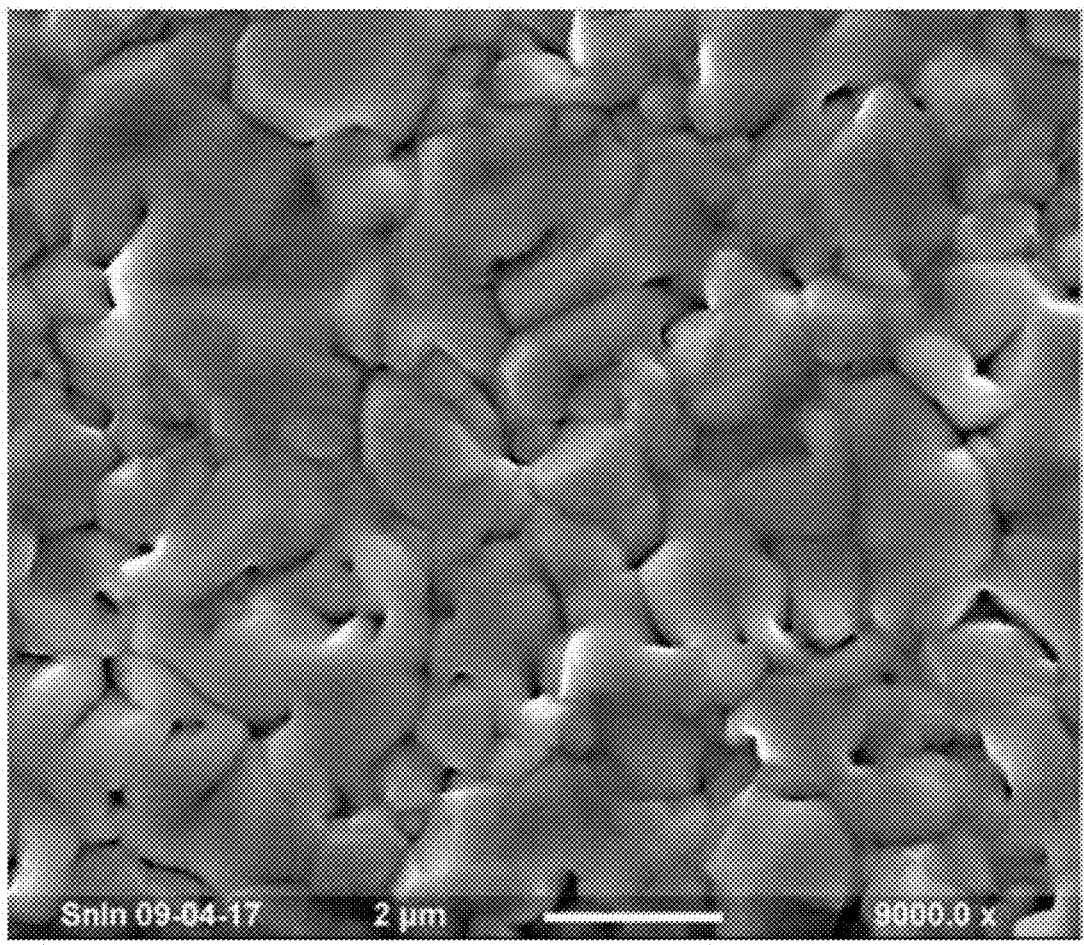
FIG. 5 shows the top surface of a Sn—In deposition sample (Sn-6In atomic %) at 9000× magnification.

FIG. 4 shows the top surface of a Sn—In deposition sample (Sn-6In atomic %) at 3000× magnification. FIG. 5 shows the top surface of a Sn—In deposition sample (Sn-6In atomic %) at 9000× magnification. The images depict a uniform crystalline morphology typical of electroplated Sn coatings. The grain sizes ranged between 1 and 2 μm, and some smaller grains were also observed.

Composition of the Electroplating

The composition of the Sn—In alloy electroplating was determined using energy dispersive spectroscopy (EDS) on a scanning electron microscope (SEM), and using a PHI 600 Auger Electron Microscope. EDS could detect signals from Cu substrates with coatings less than 3 μm. The Auger electron microscope could detect data from within 1-2 nm of the surface, and successive sputtering was used to obtain a composition as a function of depth from the surface.

Example 6

SEM/EDS

Figure 6:
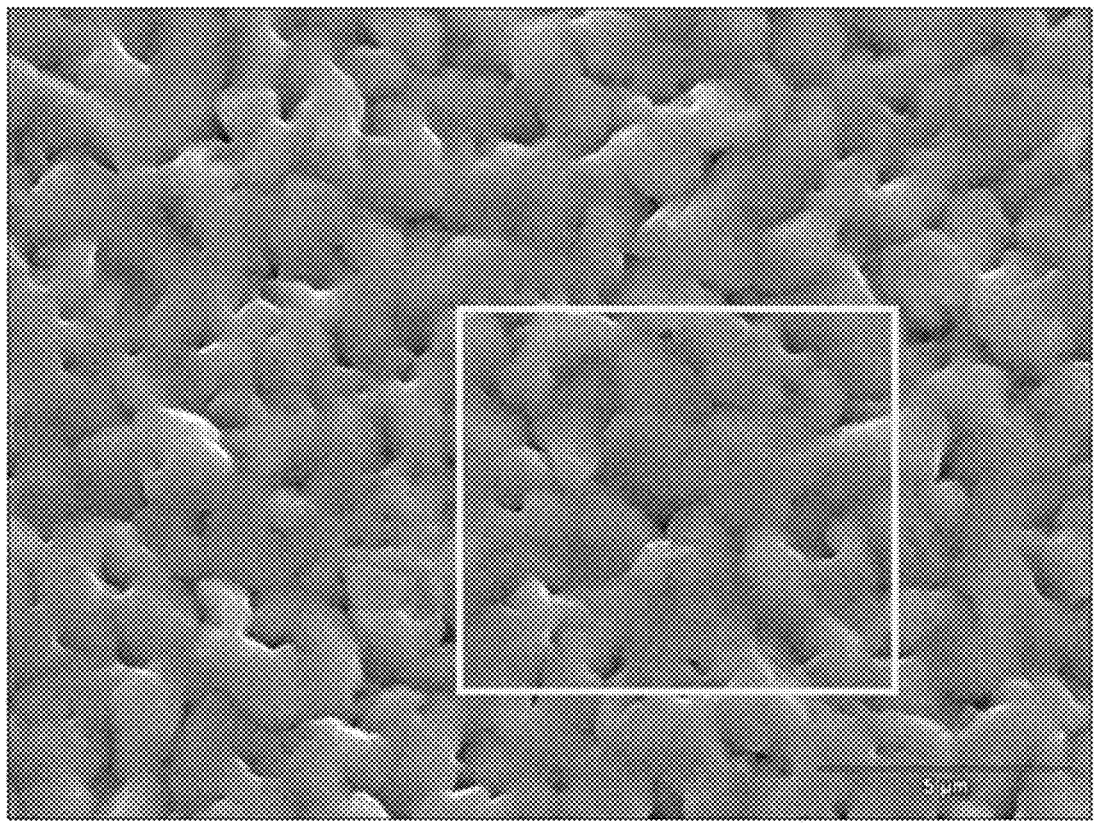
FIG. 6 shows the microstructure of the top surface of an Sn—In alloy film at 6000× magnification.

FIG. 6 shows the microstructure of the top surface of an Sn—In alloy film. The composition was averaged over the area enclosed in the white rectangular box. Sn—In alloy electrodeposition was conducted for an In content ranging from 6 to 15 atomic %. None of the coating samples exhibited any whiskers over periods ranging from 6 months to one year. In contrast, pure Sn coatings exhibited profuse whisker growth within a few days to a month of deposition.

TABLE 1 shows the composition of the Sn—In alloy film in the area enclosed in the white rectangular box of FIG. 6 (Magnification: 6000×; accelerating voltage: 25.0 kV). The EDS data in the TABLE 1 shows that the composition was approximately Sn-7.75In atomic %.

TABLE 1

Mon May 21 00:10:48 2007
Filter Fit Chi-squared value: 1.471 Errors: +/−1 Sigma
Correction Method: Proza (Phi-Rho-Z)
Acc. Voltage: 25.0 kV Take Off Angle: 35.0 deg

| Element Line | Net Counts | Net Error | k-ratio (calc.) | ZAF | Element Wt. % | Wt. % Error | Atom % | Atom % Error |
|---|---|---|---|---|---|---|---|---|
| In K | 0 | +/−0 | — | — | — | — | — | — |
| In L | 2923 | +/−269 | 0.075 | 1.008 | 7.51 | +/−0.69 | 7.75 | +/−0.71 |
| In M | 0 | +/−48 | — | — | — | — | — | — |
| Sn L | 35272 | +/−604 | 0.925 | 1.000 | 92.49 | +/−1.58 | 92.25 | +/−1.58 |
| Sn M | 0 | +/−47 | — | — | — | — | — | — |
| Total | | | | | 100.00 | | 100.00 | |

Example 7

Auger Electron Spectroscopy (AES) Results

Figure 7:
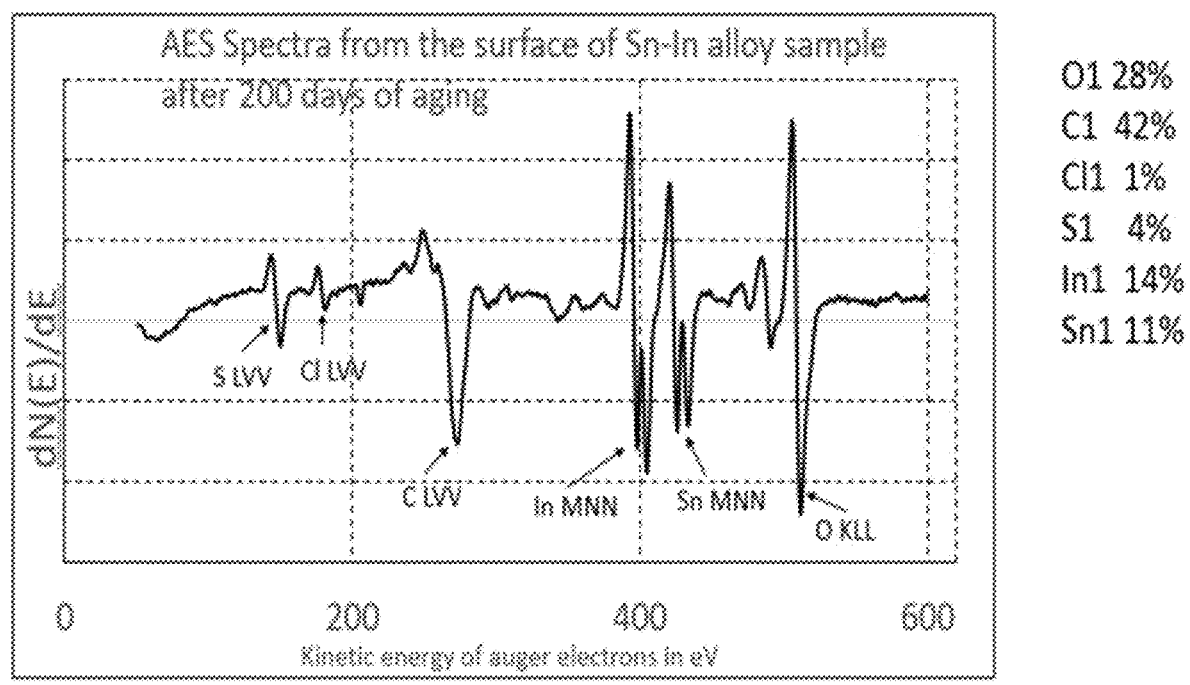
FIG. 7 shows the Auger electron spectroscopy survey plot of the surface of the Sn—In alloy plating after 200 days of aging at room temperature under ambient conditions.

FIG. 7 shows the survey plot of the surface of the Sn—In alloy plating after 200 days of aging at room temperature under ambient conditions. In addition to the characteristic Sn and In MNN Auger peaks, peaks corresponding to O, C, S, and Cl were also observed. Among these peaks, the oxygen peak resulted from chemisorbed oxygen in the form of $SnO/SnO_2$, $In_2O_3$, and oxide defects in the Sn—In layer approximately 2-4 nm in thickness. The carbon peak resulted from contamination of the surface in the laboratory environment, and was removed after approximately 150 seconds of sputtering. The S and Cl peaks persisted in small amounts to greater depths of the sample, and were absent in the pure Sn electroplated samples. The S and Cl peaks were characteristics of the plating bath. The S and Cl peaks did not have any adverse effects on whisker mitigation. Minute traces of nitrogen were also detected by AES.

Figure 8:
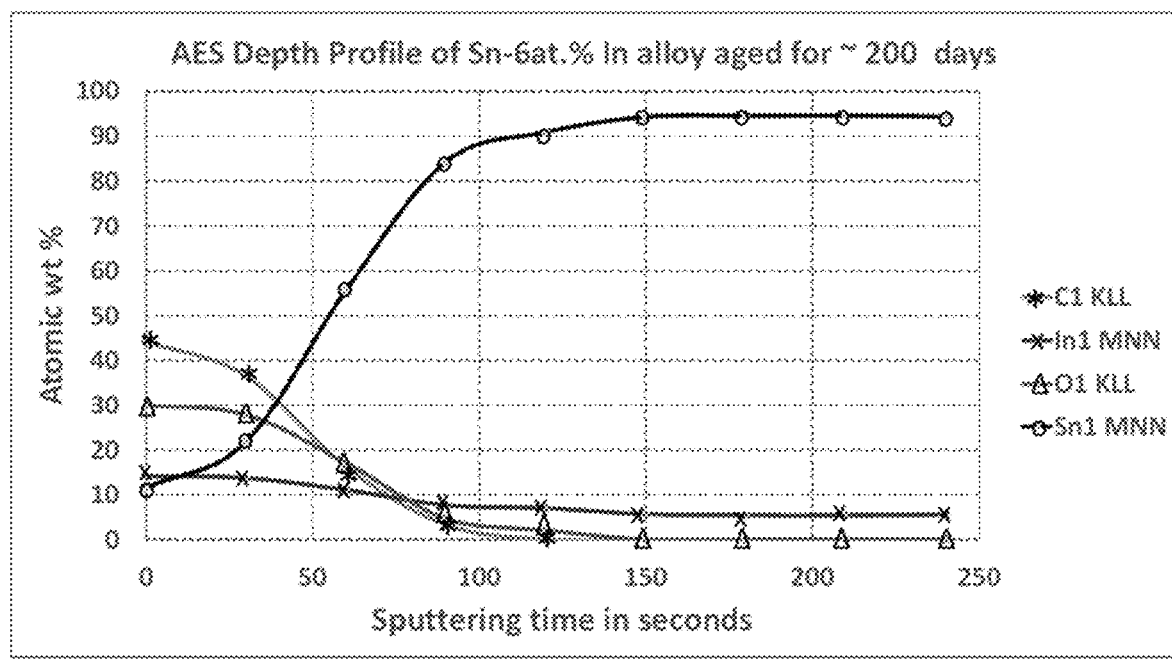
FIG. 8 shows Auger electron spectroscopy depth profiles of C, In, O, and Sn in a Sn-6 at % In alloy aged for approximately 200 days.

FIG. 8 shows AES depth profiles of C, In, O, and Sn in a Sn-6 at % In alloy aged for approximately 200 days. Based on a Si/SiO calibration sample, the sputtering rate was estimated to be about 12.5 nm/minute; 4 minutes of sputtering corresponded to a depth of 50 nm. The figure illustrates the presence of C and O peaks near the surface of the sample. The oxygen peak disappeared after approximately 90 seconds of sputtering, and represented the maximum depth of penetration of oxygen over the 200 day time period.

FIG. 8 also showed significant enrichment of indium at the surface and the near-surface region up to 150 seconds of sputtering, or an equivalent depth of approximately 30 nm. The near-surface concentration of indium was approximately 14 atomic % compared to about 6 atomic % in the bulk. AES showed that $In_2O_3$ persisted only up to 2-4 nm of the surface, demonstrating that In enrichment occurred below the surface oxide. In enrichment can occur from oxygen penetration through a defective oxide layer composed of $SnO/SnO_2$ and $In_2O_3$.

Figure 9:
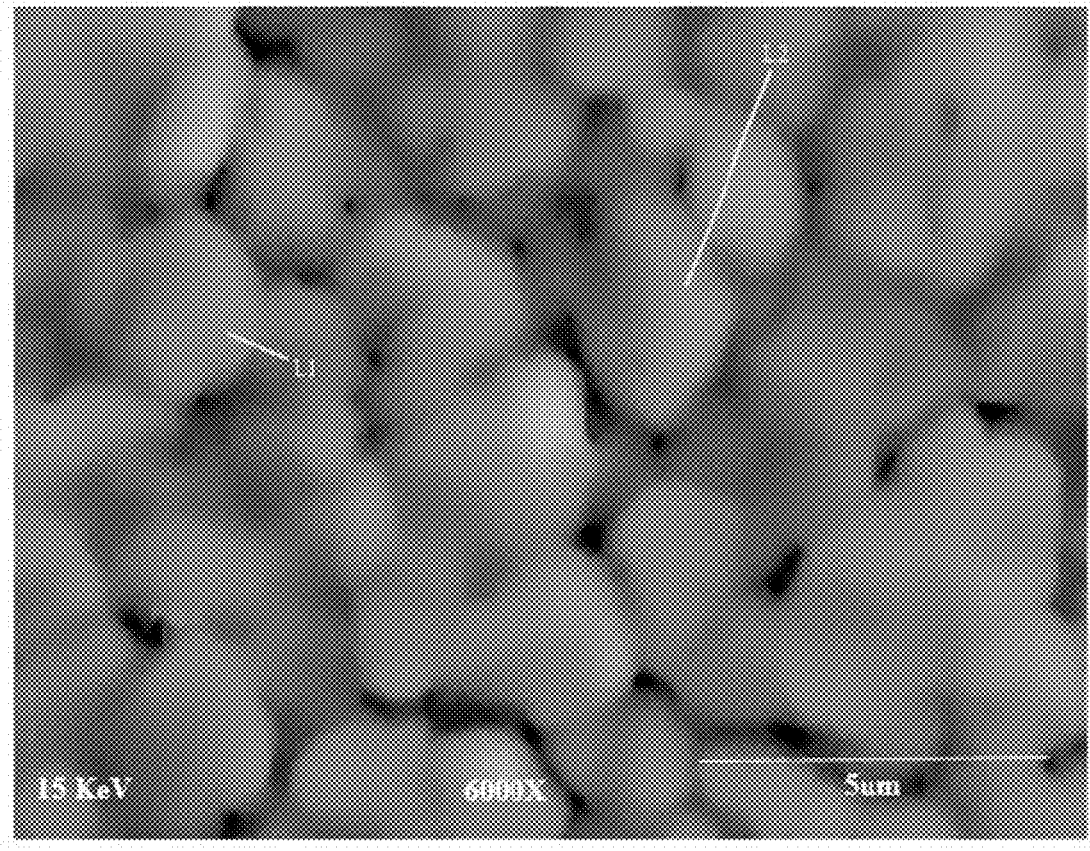
FIG. 9 shows the micrograph surface of an Sn-6In atomic % alloy film showing the path of line scans along paths L1 and L2 using a PHI 600 scanning Auger system.
Figure 10:
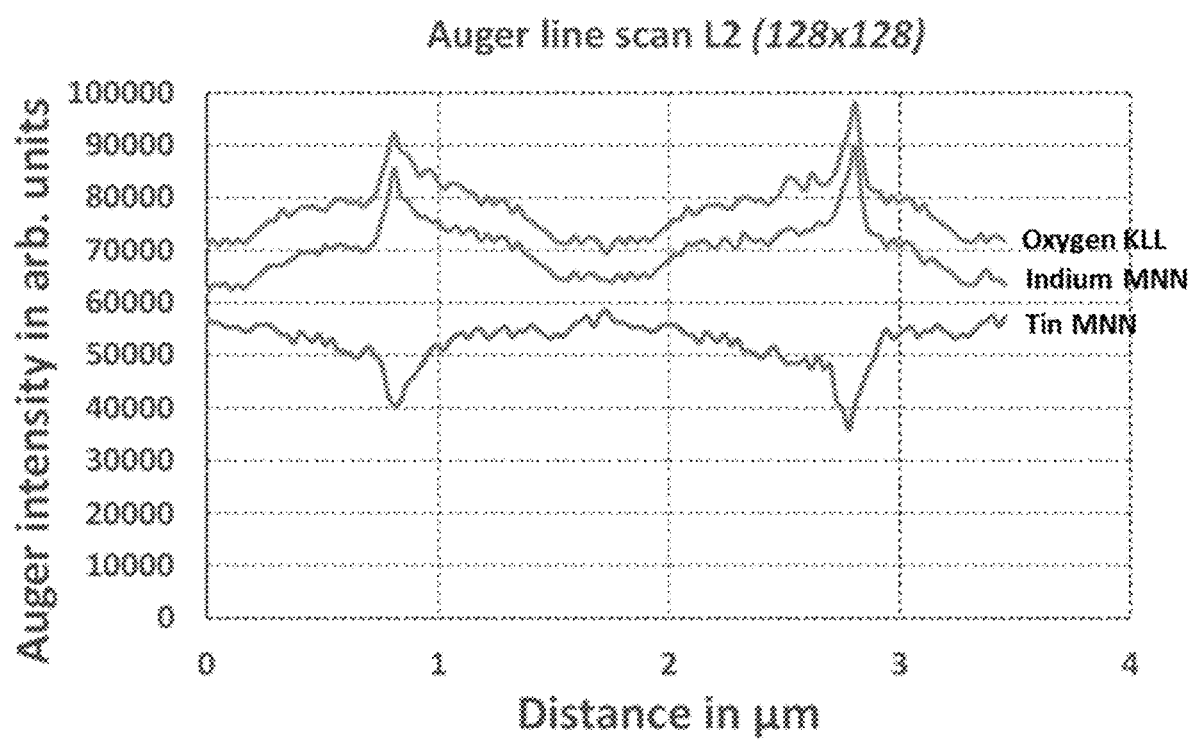

FIG. 9 shows the surface micrograph of an Sn-6In alloy showing the path of line scans along paths L1 and L2 using a PHI 600 scanning Auger system (Magnification: 6000×; accelerating voltage: 15.0 kV). FIG. 10 shows an AES intensity profile of line trace L2 in FIG. 9. Indium enrichment was observed at the grain boundaries, along with depletion of Sn. Oxygen enrichment was also observed at the grain boundaries, which was consistent with oxygen ingress being responsible for the enrichment of In. Indium enrichment near the surface and the grain boundaries, and a defective oxide scale of 2 to 4 nm in thickness can mitigate whisker formation and growth.

Example 8

Whisker Growth and Mitigation

Figure 11:
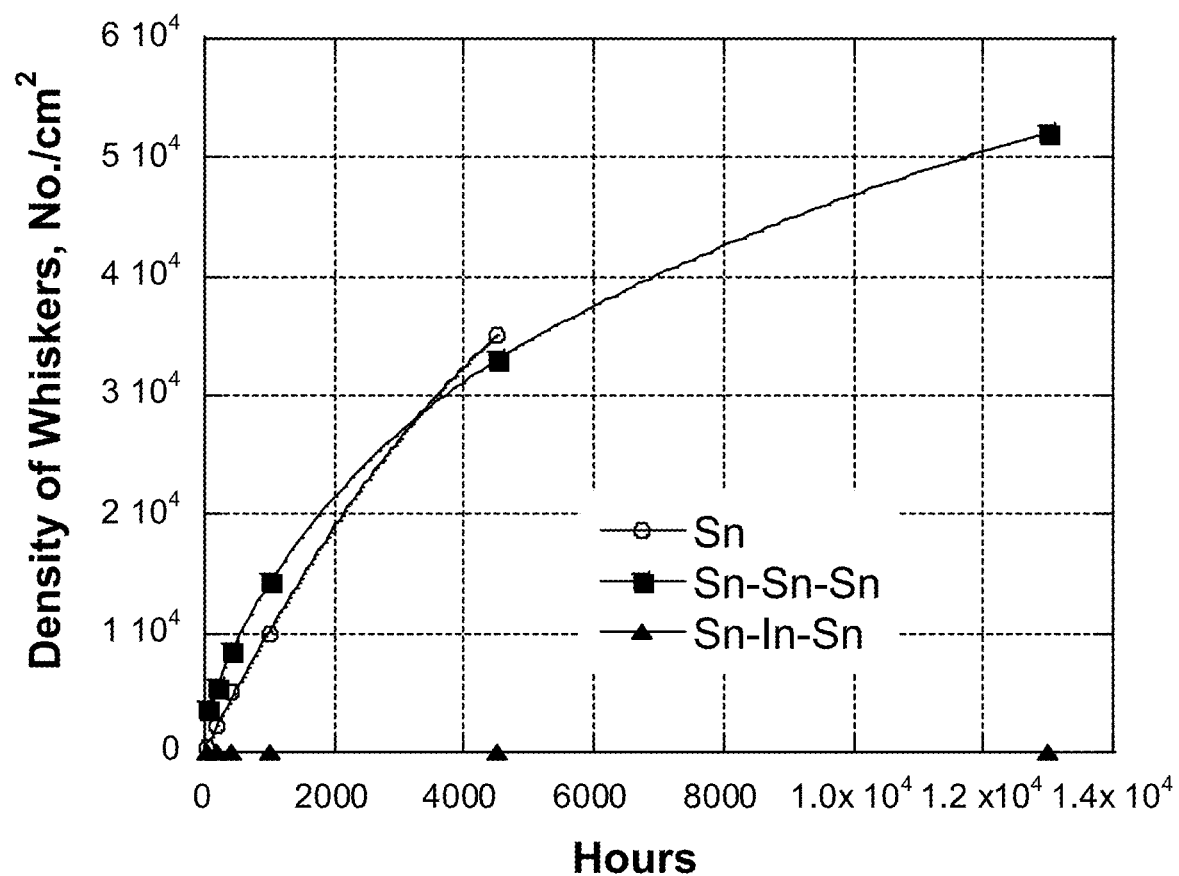
FIG. 11 shows whisker growth data for Sn and multilayered Sn—Sn—Sn and Sn—In—Sn films over a period of 1.5 years in ambient air at room temperature.

FIG. 11 shows whisker growth data for Sn and multilayered Sn—Sn—Sn and Sn—In—Sn films over a period of 1.5 years in ambient air at room temperature. The Sn sample was deposited while the multilayered samples were heat treated prior to aging. The multilayered Sn—In—Sn film did not receive simultaneous Sn—In deposition. The multilayer films were heat treated at 160° C. for 45 minutes to diffuse In into the Sn matrix. The thickness of the films were 1-2 μm. FIG. 11 shows that the Sn coatings had profuse whisker growth, while the Sn—In—Sn film exhibited no whisker growth. Only protrusions with aspect ratios (ARs) less than 5 were observed in the Sn—In—Sn films. The Sn only samples that did not receive heat treatment and the heat-treated Sn—Sn—Sn samples exhibited profuse whisker growth with whisker lengths of up to 300 micrometers.

FIG. 12-FIG. 15 illustrate the drastic changes observed in whisker and protrusion morphology in pure Sn and co-deposited Sn—In alloy samples. The protrusions in the Sn—In alloy samples had diameters in the range 2 to 4 μm, and did not grow to any significant length. Indium concentrations of 7 wt % or higher resulted in long-term whisker mitigation. Whiskers were observed in Sn—Pb samples, but were typically shorter than 50 μm and did not constitute a hazard to potential short circuiting.

Figure 12:
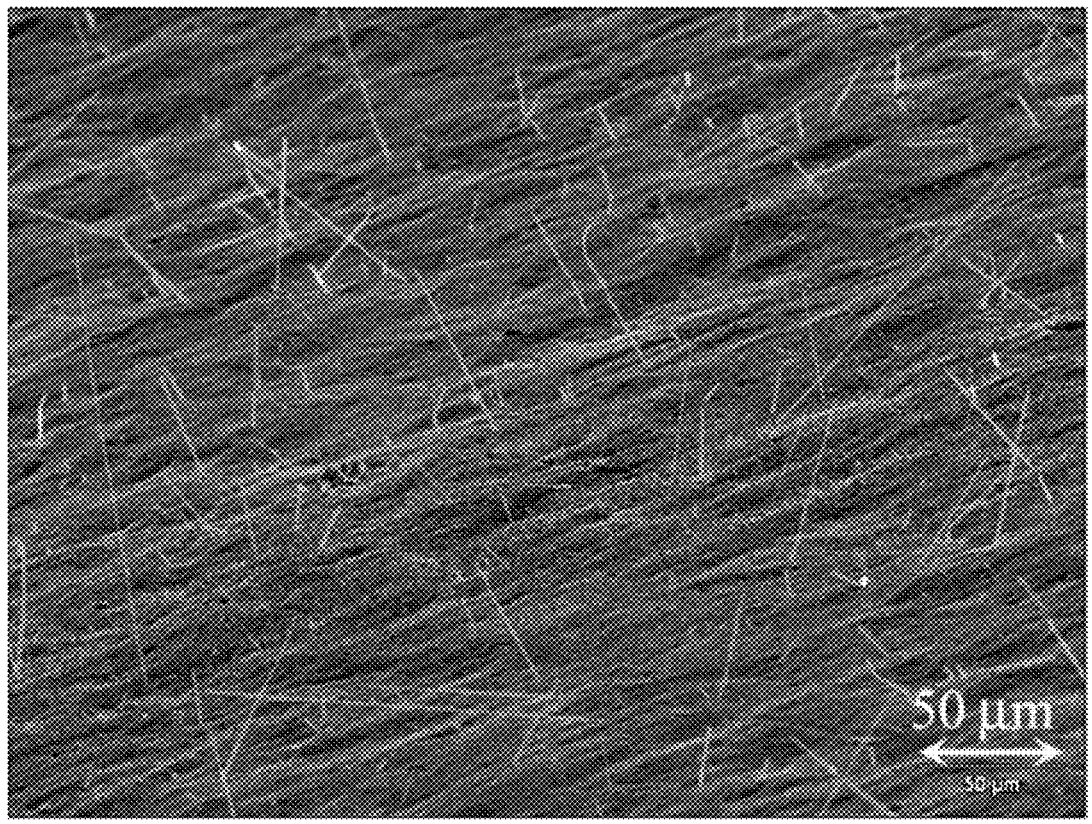
FIG. 12 shows profuse whisker growth in a pure Sn sample that was aged for approximately 90 days at room temperature at low magnification.
Figure 13:
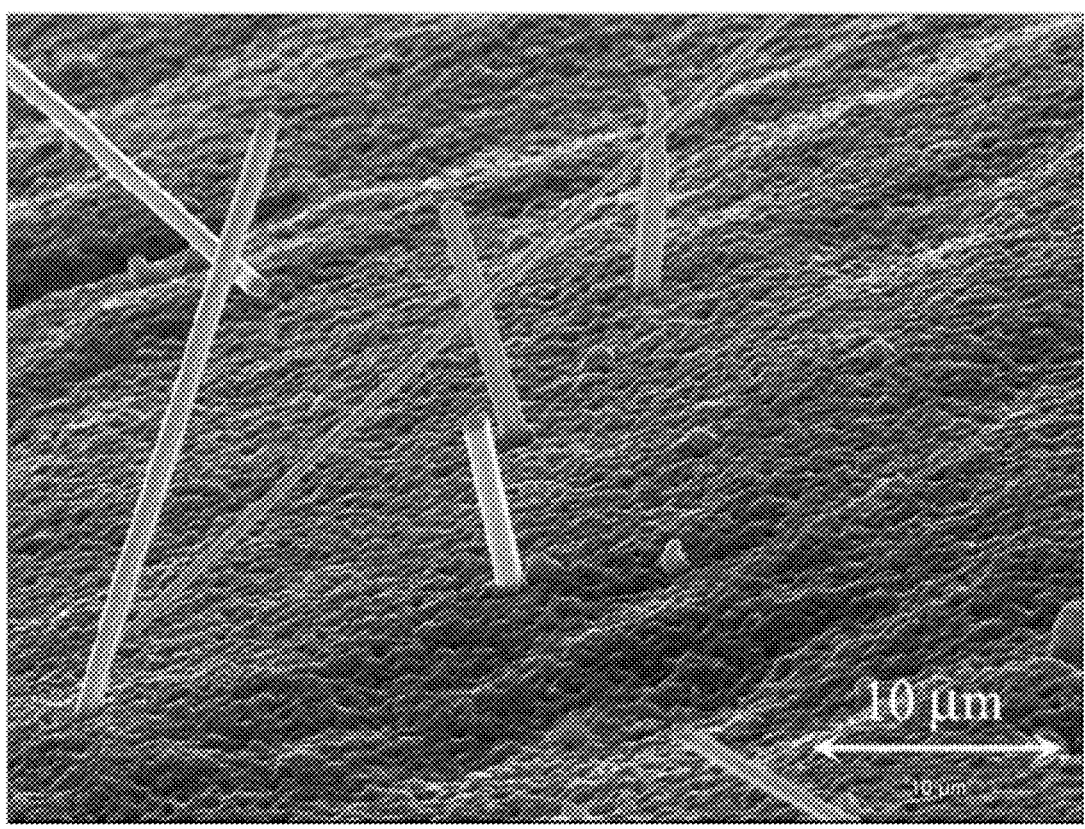
FIG. 13 shows profuse whisker growth in a pure Sn sample that was aged for approximately 90 days at room temperature at high magnification.
Figure 14:
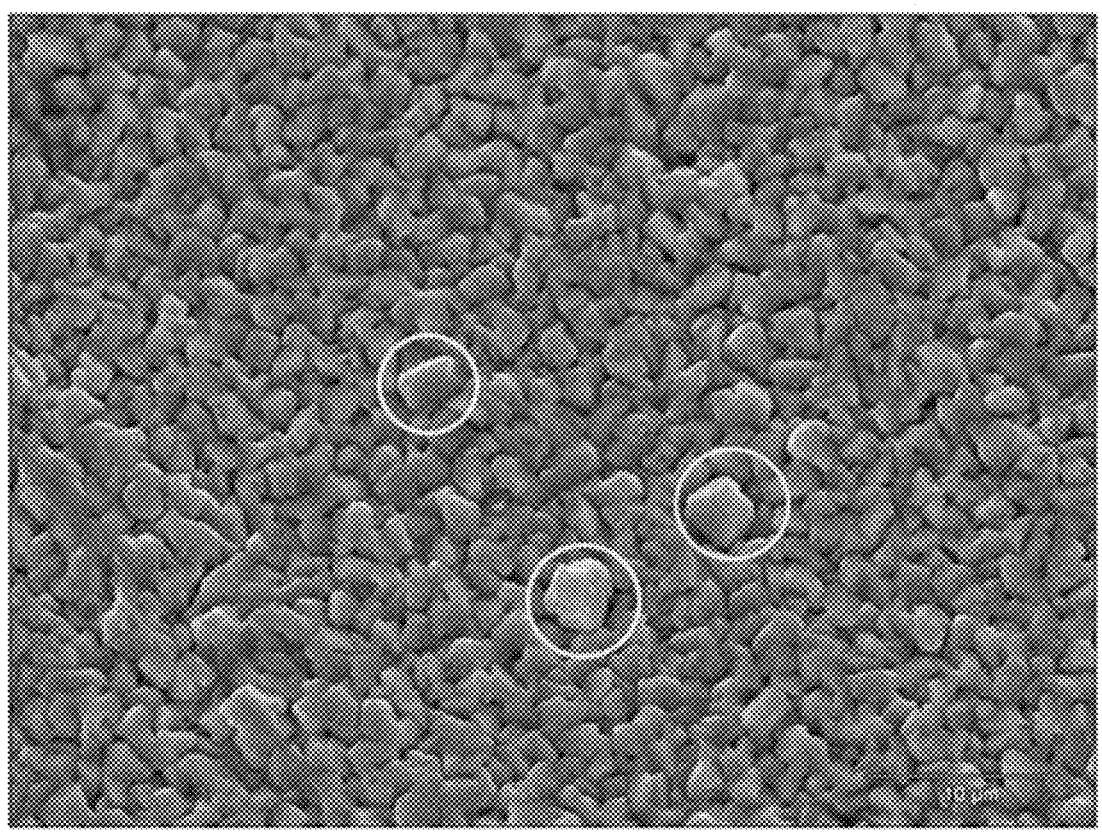
FIG. 14 shows protrusions in a co-deposited Sn—In alloy sample on a Cu substrate prepared using the sulfamate electrolyte described herein at low magnification (2500×) following 1 year of aging at room temperature.
Figure 15:
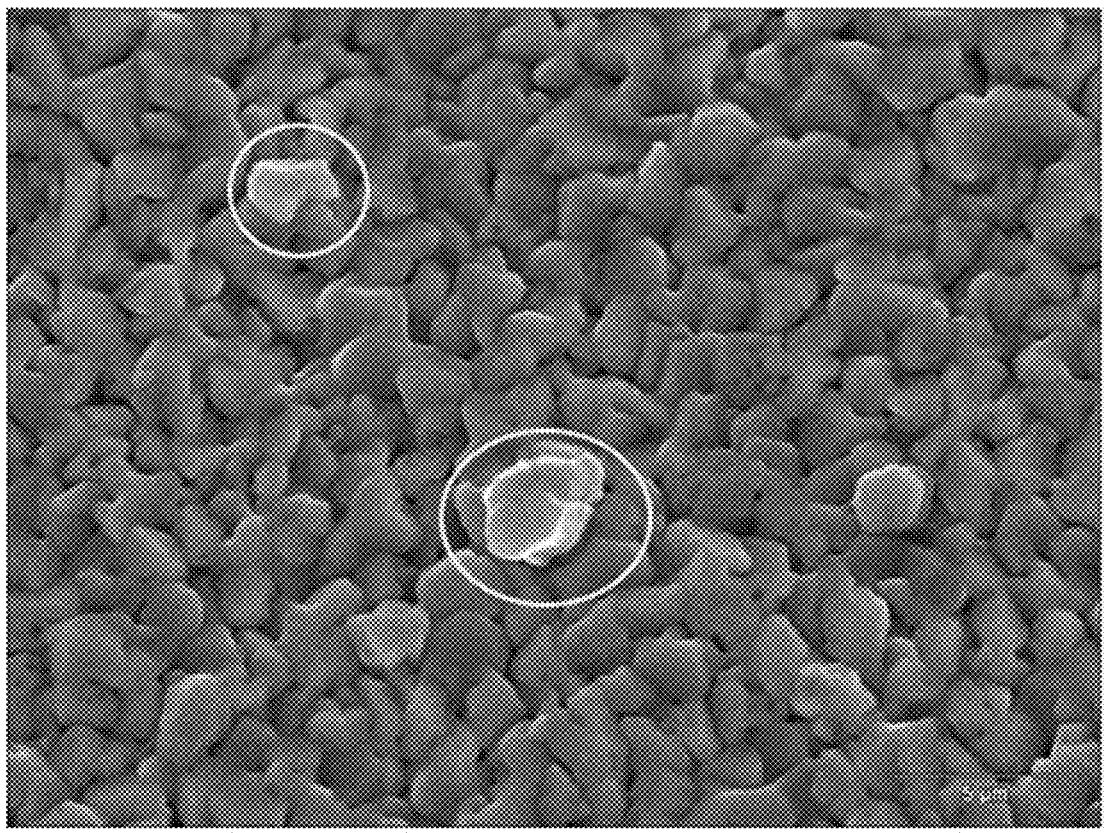
FIG. 15 shows protrusions in a co-deposited Sn—In alloy sample on a Cu substrate prepared using the sulfamate electrolyte described herein at 4500× magnification following 1 year of aging at room temperature.

FIG. 12 shows profuse whisker growth in a pure Sn sample that was aged for approximately 90 days at room temperature at low magnification. FIG. 13 shows images of whiskers in a pure Sn sample that was aged for approximately 90 days at room temperature at high magnification. The whiskers were typically 1 μm in diameter, and some of the whiskers grew to lengths exceeding 500 μm. FIG. 14 shows protrusions in a co-deposited Sn—In alloy sample on a Cu substrate prepared using the sulfamate electrolyte described herein at low magnification. The white circles indicate protrusions observed in the sample. Magnification: 2500×; accelerating voltage: 25.0 kV. FIG. 15 shows minor protrusions in a co-deposited Sn—In alloy sample on a Cu substrate prepared using the sulfamate electrolyte described herein at high magnification. The sample was aged for approximately 200 days, and no whiskers were observed. Protrusions (white circles) were observed, which had diameters of approximately 2 μm. Magnification: 4500×; accelerating voltage: 25.0 kV.

Example 9

Electrodeposition of Pure Sn and Pure In on a Substrate

The Sn—In electrodeposition bath was also utilized to deposit pure Sn and pure In by selecting an appropriate reduction potential with respect to a saturated calomel electrode.

Figure 16:
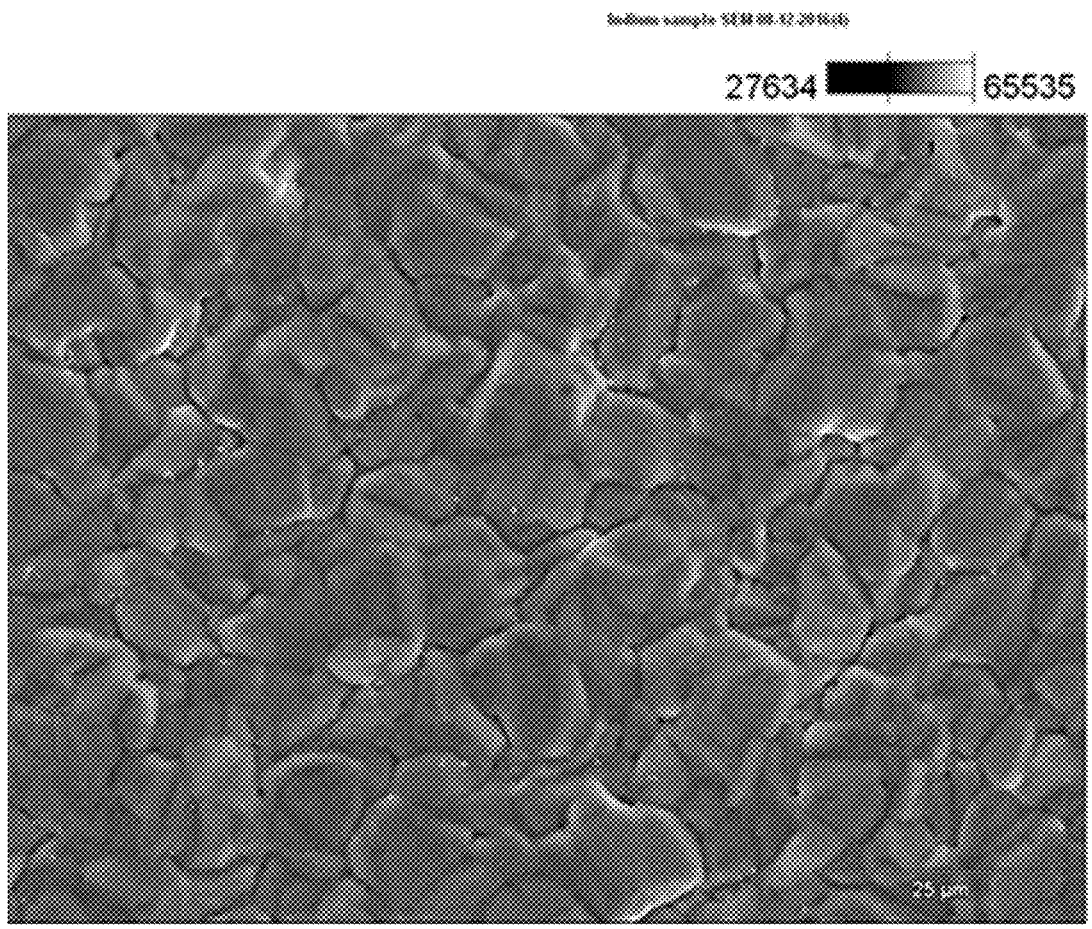
FIG. 16 shows pure indium electrodeposited from a Sn—In bath at a higher negative reduction potential (with respect to a standard calomel electrode) compared to the reduction potential of Sn—In alloy deposition. Accelerating voltage: 25.0 kV; magnification: 1200×.

FIG. 16 shows the top surface of pure In deposited using a Sn—In electrodeposition bath at a high negative potential. X-ray microanalysis of the film on the SEM showed that the material was nearly pure In. Magnification: 1200×; accelerating voltage: 25.0 kV.

Figure 17:
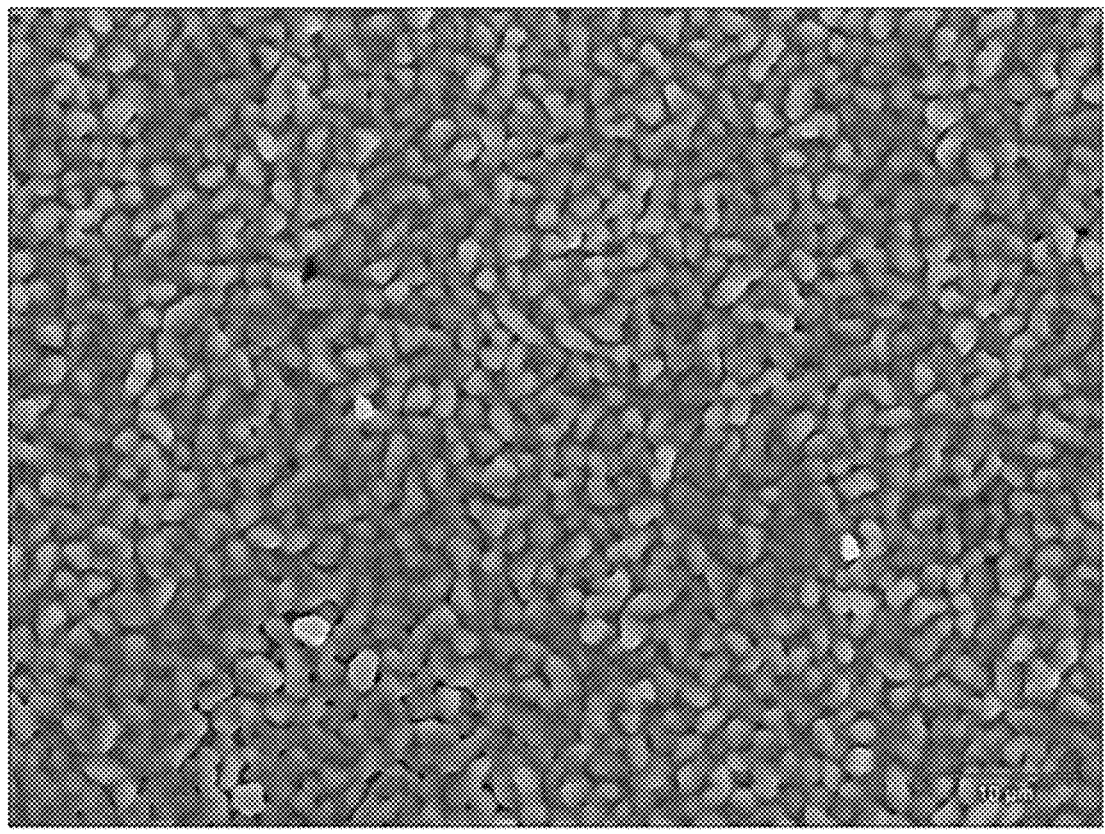
FIG. 17 shows pure tin electrodeposited from a Sn—In sulfamate bath at a high positive potential (with respect to a standard calomel electrode) compared to Sn—In alloy reduction potential without Triton™ X-100. Accelerating voltage: 25.0 kV; magnification: 1800×.

FIG. 17 shows the top surface of Sn deposited using a Sn—In electrodeposition bath at a positive potential. X-ray microanalysis of the film on the SEM showed that the material was nearly pure Sn. Magnification: 1800×; accelerating voltage: 25.0 kV.

Embodiments

The following non-limiting embodiments provide illustrative examples of the invention, but do not limit the scope of the invention.

Embodiment 1. An aqueous electroplating solution comprising: (a) a source of indium; (b) a source of tin; (c) an organic complexing agent; (d) a pH stabilizer; and (e) an inorganic complexing agent; wherein the pH of the electroplating solution is from about 1 to about 2.

Embodiment 2. The aqueous electroplating solution of embodiment 1, further comprising a non-ionic surfactant.

Embodiment 3. The aqueous electroplating solution of embodiment 2, wherein the non-ionic surfactant is polyethylene glycol p-(1,1,3,3-tetramethylbutyl)-phenyl ether.

Embodiment 4. The aqueous electroplating solution of any one of embodiments 1-3, wherein the source of indium is present in the aqueous electroplating solution in an amount of about 0.002 mol/L to about 0.012 mol/L.

Embodiment 5. The aqueous electroplating solution of any one of embodiments 1-4, wherein the source of indium is $InCl_3$ or a hydrate thereof.

Embodiment 6. The aqueous electroplating solution of any one of embodiments 1-5, wherein the source of tin is present in the aqueous electroplating solution in an amount of about 0.01 mol/L to about 0.10 mol/L.

Embodiment 7. The aqueous electroplating solution of any one of embodiments 1-6, wherein the source of tin is sodium tin oxide or a hydrate thereof.

Embodiment 8. The aqueous electroplating solution of any one of embodiments 1-7, wherein the organic complexing agent is a nitrogenous complexing agent.

Embodiment 9. The aqueous electroplating solution of embodiment 8, wherein the nitrogenous complexing agent is triethanolamine.

Embodiment 10. The aqueous electroplating solution of any one of embodiments 1-9, wherein the pH stabilizer is present in the aqueous electroplating solution in an amount of about 0.02 mol/L to about 0.20 mol/L.

Embodiment 11. The aqueous electroplating solution of any one of embodiments 1-10, wherein the pH stabilizer is an acid.

Embodiment 12. The aqueous electroplating solution of embodiment 11, wherein the acid is hydrochloric acid.

Embodiment 13. The aqueous electroplating solution of any one of embodiments 1-12, wherein the inorganic complexing agent is a base.

Embodiment 14. The aqueous electroplating solution of embodiment 13, wherein the base is sodium hydroxide.

Embodiment 15. The aqueous electroplating solution of any one of embodiments 1-14, wherein the aqueous electroplating solution further comprises a reducing agent.

Embodiment 16. The aqueous electroplating solution of embodiment 15, wherein the reducing agent is an aldehyde.

Embodiment 17. The aqueous electroplating solution of embodiment 16, wherein the aldehyde is a carbohydrate.

Embodiment 18. The aqueous electroplating solution of embodiment 15, wherein the reducing agent is dextrose.

Embodiment 19. A method comprising contacting an anode, a reference electrode, and a substrate to an aqueous electroplating solution, wherein the aqueous electroplating solution comprises: (a) a source of indium; (b) a source of tin; (c) an organic complexing agent; (d) a pH stabilizer; and (e) an inorganic complexing agent, wherein the electroplating solution has a pH from about 1 to about 2.

Embodiment 20. The method of embodiment 19, wherein the anode, the reference electrode, and the substrate are in a circuit.

Embodiment 21. The method of embodiment 19 or 20, further comprising electroplating a metal on the substrate.

Embodiment 22. The method of any one of embodiments 19-21, wherein the method further comprises cleaning the substrate prior to the electroplating.

Embodiment 23. The method of any one of embodiments 20-22, wherein the anode is an indium foil or a Sn—In alloy foil.

Embodiment 24. The method of any one of embodiments 20-23, wherein the reference electrode is a calomel electrode.

Embodiment 25. The method of any one of embodiments 19-24, wherein the source of indium is present in the aqueous electroplating solution in an amount of about 0.001 mol/L to about 0.01 mol/L.

Embodiment 26. The method of any one of embodiments 19-25, wherein the source of indium is $InCl_3$ or a hydrate thereof.

Embodiment 27. The method of any one of embodiments 19-26, wherein the source of tin is present in the aqueous electroplating solution in an amount of about 0.01 mol/L to about 0.1 mol/L.

Embodiment 28. The method of any one of embodiments 19-27, wherein the source of tin is sodium tin oxide or a hydrate thereof.

Embodiment 29. The method of any one of embodiments 19-28, wherein the organic complexing agent is a nitrogenous complexing agent.

Embodiment 30. The method of embodiment 29, wherein the nitrogenous complexing agent is triethanolamine.

Embodiment 31. The method of any one of embodiments 19-30, wherein the pH stabilizer is present in the aqueous electroplating solution in an amount of about 0.05 mol/L to about 0.2 mol/L.

Embodiment 32. The method of any one of embodiments 19-31, wherein the pH stabilizer is an acid.

Embodiment 33. The method of embodiment 32, wherein the acid is hydrochloric acid.

Embodiment 34. The method of any one of embodiments 19-33, wherein the inorganic complexing agent is a base.

Embodiment 35. The method of embodiment 34, wherein the base is sodium hydroxide.

Embodiment 36. The method of any one of embodiments 19-35, wherein the aqueous electroplating solution further comprises a reducing agent.

Embodiment 37. The method of embodiment 36, wherein the reducing agent is an aldehyde.

Embodiment 38. The method of embodiment 37, wherein the aldehyde is a carbohydrate.

Embodiment 39. The method of embodiment 36, wherein the reducing agent is dextrose.

Embodiment 40. The method of any one of embodiments 19-39, wherein the aqueous electroplating solution further comprises a non-ionic surfactant.

Embodiment 41. The method of embodiment 40, wherein the non-ionic surfactant is polyethylene glycol p-(1,1,3,3-tetramethylbutyl)-phenyl ether.

Embodiment 42. The method of embodiment 20, wherein the substrate is a copper substrate.

Embodiment 43. The method of embodiments 20 or 42, wherein the method further comprises cleaning the copper substrate before connecting the copper substrate to the circuit.

Embodiment 44. The method of any one of embodiments 19-43, wherein the aqueous electroplating solution is at room temperature.

Embodiment 45. The method of any one of embodiments 19-43, wherein the aqueous electroplating solution is at about 60° C. to about 110° C.

Embodiment 46. An electroplating bath prepared by a process, the process comprising: (i) dissolving an inorganic complexing agent in deionized water in a container; (ii) adding a cleaning agent to the container; (iii) preparing an indium solution comprising an indium source, an acid, and water; (iv) adding the indium solution to the container; (v) adding a reducing agent and an organic complexing agent to the container; (vi) preparing a tin solution comprising a source of tin and water; and (vii) adding the tin solution to the container.

Embodiment 47. The electroplating bath of embodiment 46, wherein the process further comprises adding a non-ionic surfactant to the container.

Embodiment 48. The electroplating bath of embodiment 47, wherein the non-ionic surfactant is polyethylene glycol p-(1,1,3,3-tetramethylbutyl)-phenyl ether.

Embodiment 49. The electroplating bath of any one of embodiments 46-48, wherein the process further comprises adding an alkali tartrate or an alkali citrate to the container.

Embodiment 50. The electroplating bath of any one of embodiments 46-49, wherein the inorganic complexing agent is sodium hydroxide.

Embodiment 51. The electroplating bath of any one of embodiments 46-50, wherein the cleaning agent is sulfamic acid.

Embodiment 52. The electroplating bath of any one of embodiments 46-51, wherein the indium source is $InCl_3$ or a hydrate thereof.

Embodiment 53. The electroplating bath of any one of embodiments 46-52, wherein the reducing agent is an aldehyde.

Embodiment 54. The electroplating bath of embodiment 53, wherein the aldehyde is a carbohydrate.

Embodiment 55. The electroplating bath of embodiment 53, wherein the reducing agent is dextrose.

Embodiment 56. The electroplating bath of any one of embodiments 46-55, wherein the organic complexing agent is a nitrogenous complexing agent.

Embodiment 57. The electroplating bath of embodiment 56, wherein the nitrogenous complexing agent is triethanolamine.

Embodiment 58. The electroplating bath of any one of embodiments 46-57, wherein the source of tin is tin oxide or a hydrate thereof.

Embodiment 59. The electroplating bath of any one of embodiments 46-58, wherein the wherein the process further comprises adding an acid to the container.

Embodiment 60. The electroplating bath of any one of embodiments 46-59, having a pH from about 1 to about 2.

What is claimed is:

1. An aqueous electroplating solution comprising:
   (a) a source of indium, wherein the source of indium is present in the aqueous electroplating solution in an amount of from about 0.002 mol/L to about 0.012 mol/L;
   (b) a source of tin, wherein the source of tin is sodium stannate trihydrate, wherein the source of tin is present in the aqueous electroplating solution in an amount of from about 0.01 mol/L to about 0.10 mol/L;
   (c) an organic complexing agent comprising a nitrogenous complexing agent;
   (d) a pH stabilizer, wherein the pH stabilizer is present in the aqueous electroplating solution in an amount of from about 0.02 mol/L to about 0.2 mol/L; and
   (e) an inorganic complexing agent, wherein the inorganic complexing agent is present in the aqueous electroplating solution in an amount of from about 0.2 mol/L to about 0.8 mol/L;
   wherein the electroplating solution has a pH from about 1 to about 2.

2. The aqueous electroplating solution of claim 1, further comprising a non-ionic surfactant.

3. The aqueous electroplating solution of claim 2, wherein the non-ionic surfactant is polyethylene glycol p-(1,1,3,3-tetramethylbutyl)-phenyl ether.

4. The aqueous electroplating solution of claim 1, wherein the source of indium is $InCl_3$ or a hydrate thereof.

5. The aqueous electroplating solution of claim 1, wherein the nitrogenous complexing agent is triethanolamine.

6. The aqueous electroplating solution of claim 1, wherein the pH stabilizer is an acid.

7. The aqueous electroplating solution of claim 6, wherein the acid is hydrochloric acid.

8. The aqueous electroplating solution of claim 1, wherein the inorganic complexing agent is a base.

9. The aqueous electroplating solution of claim 8, wherein the base is sodium hydroxide.

10. The aqueous electroplating solution of claim 1, wherein the aqueous electroplating solution further comprises a reducing agent.

11. The aqueous electroplating solution of claim 10, wherein the reducing agent is an aldehyde.

12. The aqueous electroplating solution of claim 11, wherein the aldehyde is a carbohydrate.

13. The aqueous electroplating solution of claim 10, wherein the reducing agent is dextrose.

14. The aqueous electroplating solution of claim 1 further comprising a cleaning agent and an antioxidant.

15. The aqueous electroplating solution of claim 14, wherein the cleaning agent is sulfamic acid.

16. The aqueous electroplating solution of claim 14, wherein the antioxidant comprises an alkali tartrate or an alkali citrate.

17. The aqueous electroplating solution of claim 1, wherein the source of indium is present in the solution in an amount of about 10% (v/v).

18. The aqueous electroplating solution of claim 1, wherein the source of indium is present in the solution in an amount of about 20% (v/v).

* * * * *